(12) United States Patent
Rajamani

(10) Patent No.: US 8,166,218 B2
(45) Date of Patent: Apr. 24, 2012

(54) MEMORY BUFFERS FOR MERGING LOCAL DATA FROM MEMORY MODULES

(75) Inventor: Ramasubramanian Rajamani, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 385 days.

(21) Appl. No.: 12/154,536

(22) Filed: May 23, 2008

(65) Prior Publication Data

US 2009/0013108 A1 Jan. 8, 2009

Related U.S. Application Data

(63) Continuation of application No. 11/047,890, filed on Jan. 31, 2005, now abandoned.

(51) Int. Cl.
G06F 13/12 (2006.01)
G06F 13/28 (2006.01)

(52) U.S. Cl. .............. 710/71; 710/29; 710/36; 711/109; 711/150; 711/169

(58) Field of Classification Search ......................... None
See application file for complete search history.

(56) References Cited

U.S. PATENT DOCUMENTS

| | | | |
|---|---|---|---|
| 3,914,741 A | 10/1975 | Bonser et al. | |
| 4,541,091 A | 9/1985 | Nishida et al. | |
| 4,672,609 A | 6/1987 | Humphrey et al. | |
| 4,907,228 A | 3/1990 | Bruckert et al. | |
| 5,173,905 A | 12/1992 | Parkinson et al. | |
| 5,455,834 A | 10/1995 | Chang et al. | |
| 5,530,835 A | 6/1996 | Vashi et al. | |
| 5,900,742 A * | 5/1999 | Kolze et al. | .................... 326/41 |
| 5,940,137 A | 8/1999 | Hulvey | |
| 5,940,313 A | 8/1999 | Senba | |

(Continued)

FOREIGN PATENT DOCUMENTS

JP 04-369720 A 12/1992

(Continued)

OTHER PUBLICATIONS

International Search Report/Written Report for Patent Application No. PCT/US2006/003445, mailed Jul. 7, 2006, 10 pages.

(Continued)

*Primary Examiner* — Eron J Sorrell
*Assistant Examiner* — Dean Phan
(74) *Attorney, Agent, or Firm* — Caven & Aghevli LLC

(57) ABSTRACT

An integrated circuit to serialize local data and selectively merge it with serialized feed-through data into a serial data stream output that includes a parallel-in-serial-out (PISO) shift register, a multiplexer, and a transmitter. The PISO shift register serializes parallel data on a local data bus into serialized local data. The multiplexer selectively merges serialized local data and feed-through data into a serial data stream. The transmitter drives the serial data stream onto a serial data link. In another embodiment of the invention, a method for a memory module includes receiving an input serial data stream; merging local frames of data and feed-through frames of data together into an output serial data stream in response to a merge enable signal; and transmitting the output serial data stream on a northbound data output to a next memory module or a memory controller. Other embodiments of the invention are disclosed and claimed.

10 Claims, 10 Drawing Sheets

U.S. PATENT DOCUMENTS

| | | | |
|---|---|---|---|
| 5,996,113 | A | 11/1999 | Korn et al. |
| 6,101,198 | A | 8/2000 | Koenig et al. |
| 6,760,743 | B1 | 7/2004 | Heddes et al. |
| 7,243,543 | B2 | 7/2007 | Berg |
| 7,428,686 | B2 | 9/2008 | Aoyama et al. |
| 7,827,462 | B2 | 11/2010 | Vogt |
| 2001/0037406 | A1 | 11/2001 | Philbrick et al. |
| 2002/0130795 | A1* | 9/2002 | Moon .......................... 341/61 |
| 2004/0139253 | A1 | 7/2004 | Perego et al. |
| 2004/0193821 | A1* | 9/2004 | Ruhovets et al. ............. 711/167 |
| 2005/0007805 | A1 | 1/2005 | Ware et al. |
| 2005/0097955 | A1 | 5/2005 | Berg |
| 2006/0095620 | A1 | 5/2006 | Dreps et al. |
| 2006/0236196 | A1 | 10/2006 | Vogt et al. |
| 2006/0242537 | A1 | 10/2006 | Lich |

FOREIGN PATENT DOCUMENTS

| | | | |
|---|---|---|---|
| JP | 09-081463 | A | 3/1997 |
| JP | 20040193664 | A | 8/2004 |
| TW | 200705170 | A | 2/2007 |
| WO | 2004/102403 | A2 | 11/2004 |
| WO | 2006/083899 | A1 | 8/2006 |

OTHER PUBLICATIONS

International Preliminary Report for Patent Application No. PCT/US2006/003445, mailed Sep. 8, 2007, 7 pages.

Office Action received for Korean Patent Application No. 2007-7025113 mailed on Sep. 28, 2009, 4 pages of English Translation only.

International Preliminary Report on Patentability received for PCT Application No. PCT/US06/12599, mailed on Oct. 11, 2007, 11 pages.

International Search Report and Written Opinion received for PCT Application No. PCT/US06/12599, mailed on Mar. 26, 2007, 15 pages.

Office Action Received for Taiwan Patent Application No. 95111496, mailed on Sep. 2, 2009, 7 pages of Office action and 5 pages of English Translation.

Office Action received for German Patent Application No. 11 2006 000 298.8, mailed on Feb. 2, 2010, 3 pages of Office Action and 4 pages of English Translation.

Office Action received for U.S. Appl. No. 11/047,890, mailed on Jan. 18, 2008, 17 pages.

Office Action received for U.S. Appl. No. 11/047,890, mailed on Oct. 21, 2008, 10 pages.

Office Action received for German Patent Application No. 11 2006 000 298.8, mailed on Sep. 11, 2008, 2 pages of OA and 2 pages of English Translation.

Office Action received for Korean Patent Application No. 10-2007-7017728, mailed on Nov. 29, 2008, 4 pages of Office Action and 5 pages of English Translation.

Office Action received for U.S. Appl. No. 11/097,955, mailed on Jan. 28, 2008,11 pages.

Notice of Allowance received for U.S. Appl. No. 11/097,955, mailed on Oct. 9, 2009, 6 pages.

Supplementary Notice of Allowance received for U.S. Appl. No. 11/097,955 , mailed on Feb. 19, 2010, 8 pages.

Office Action received for GB Patent Application No. GB0714819.0, mailed on Aug. 26, 2009, 3 pages.

Office Action Received for Japanese Patent Application No. 2007-553363, mailed on Aug. 2, 2011, 3 pages of Office Action and 3 pages of English translation.

Notice of Allowance received for U.S. Appl. No. 11/097,955, mailed on Jun. 24, 2010, 14 pages.

Office Action Received for Taiwan Patent Application No. 95103736 mailed on Apr. 22, 2010, 8 pages of Office Action Only.

Office Action Received for GB patent Application No. GB0714910.7, mailed on Feb. 12, 2009, 3 pages of Office Action Only.

Office Action Received for GB Patent Application No. GB0714910.7, mailed on Sep. 19, 2008, 2 pages of Office Action Only.

Notice of Allowance Received for Korean Patent Application No. 10-2007-7025113, mailed on Jan. 18, 2010, 2 pages of Notice of Allowance and 1 page of English Translation.

Notice of Allowance Received for Taiwan Patent Application No. 95111496, mailed on May 27, 2010, 2 pages of Notice of Allowance and 1 page of English Translation.

Office Action Received for Japanese Patent Application No. 2007-553363, mailed on Jan. 4, 2011, 2 pages of Office Action and 2 pages of English Translation.

Notice of Allowance Received for Taiwan Patent Application No. 95103736, mailed on Sep. 29, 2010, 2 pages of Notice of Allowance and 1 page of English Translation.

Office Action Received for German Patent Application No. 11 2006 000 349.6, mailed on Jul. 22, 2010, 8 pages of Office Action and 8 pages of English Translation.

Office Action Received for Japanese Patent Application No. P2008-504531, mailed on Jan. 17, 2011, 3 pages of Office Action and 3 pages of English Translation.

Office Action Received for U.S. Appl. No. 11/097,955, mailed on Oct. 22, 2008, 10 pages.

\* cited by examiner

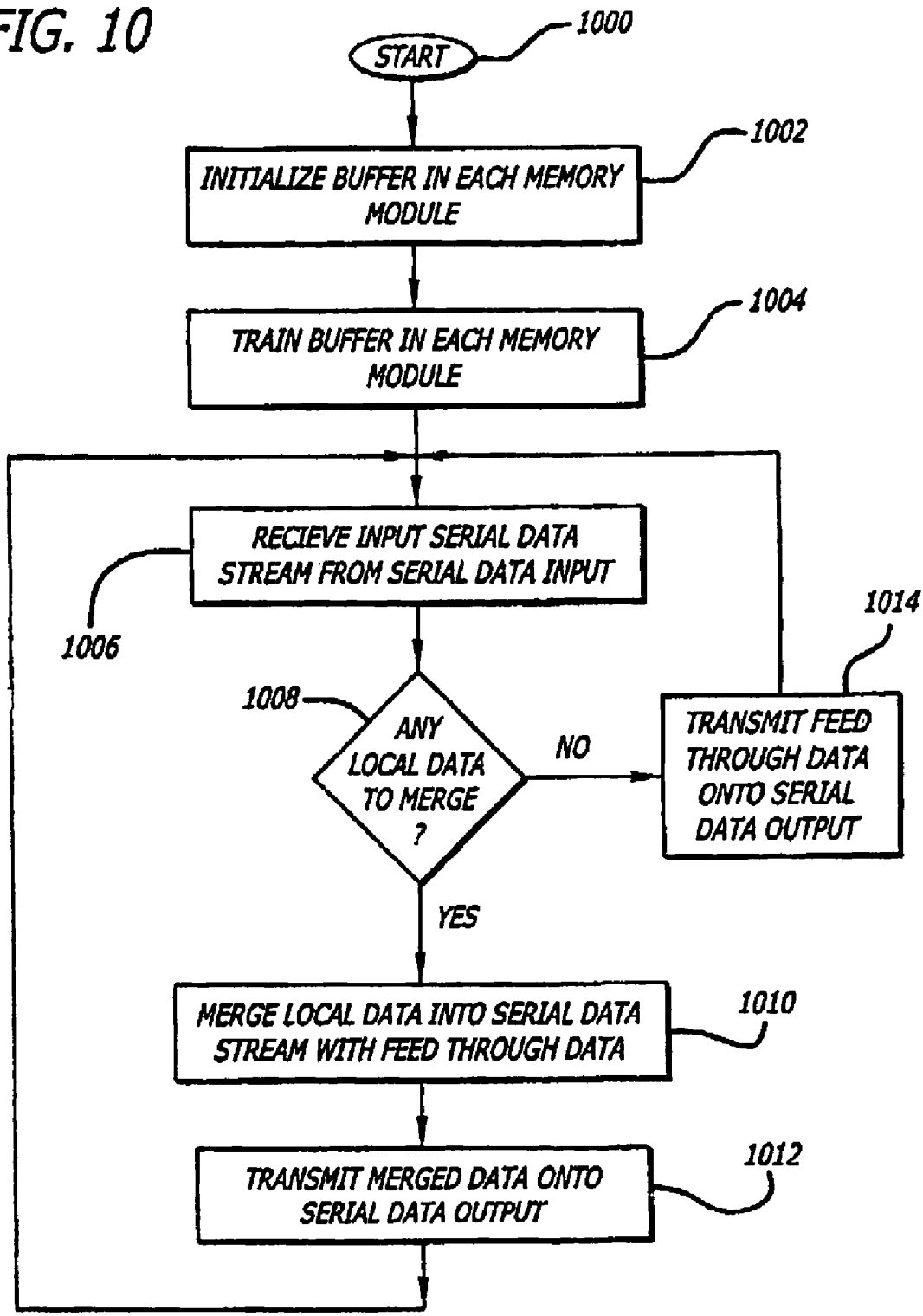

MEMORY BUFFERS FOR MERGING LOCAL DATA FROM MEMORY MODULES

This application is a continuation application of application Ser. No. 11/047,890, titled "MEMORY BUFFERS FOR MERGING LOCAL DATA FROM MEMORY MODULES", filed Jan. 31, 2005 now abandoned.

FIELD

Embodiments of the invention relate generally to memory, and specifically to merging data from a memory buffer onto serial data channels.

BACKGROUND INFORMATION

In memory circuits there is typically a memory read latency that is the time period it takes for valid data to be read out of a memory circuit. A memory write latency is typically also required that is the time period to hold valid data for a memory circuit to write the data into memory. The memory read latency and the memory write latency may sometimes be buffered from a processor by a cache memory. However, there are occasions when the desired data is not found in the cache memory. In those cases, a processor may need to then read or write data with the memory circuits. Thus, the respective memory read latency or memory write latency may be experienced by the processor. If memory circuits differ, the memory read latencies and memory write latency may be inconsistent from one memory circuit to the next. In which case, the memory read latency and memory write latency experienced by a processor will differ.

Previously, memory modules were plugged into a mother or host printed circuit board and coupled in parallel to a parallel data bus over which parallel data could be read from and written into memory. The parallel data bus had parallel data bit lines that were synchronized together to transfer one or more data bytes or words of data at a time. The parallel data bit lines are typically routed over a distance on a printed circuit board (PCB) from one memory module socket to another. This introduces a first parasitic capacitive load. As the memory modules are plugged into a memory socket, an additional parasitic capacitive load is introduced onto the parallel data bits lines of the parallel data bus. As there may be a number of memory modules plugged in, the additional parasitic capacitive load may be significant and bog down high frequency memory circuits.

One memory module is typically addressed by an address on address lines at a time. The one addressed memory module, typically writes data onto the parallel data bus at a time. Other memory modules typically have to wait to write data onto the parallel data bus in order to avoid collisions.

While parallel data bit lines may speed data flow in certain instances, a parallel data bus in a memory may slow the read and write access of data between a memory circuit and a processor.

BRIEF DESCRIPTION OF THE DRAWINGS

FIG. 10 illustrates a flow chart for the initialization, training, and functioning of the buffer in merging local data and feed through data together into a serial data stream output.

DETAILED DESCRIPTION

Figure 1A:
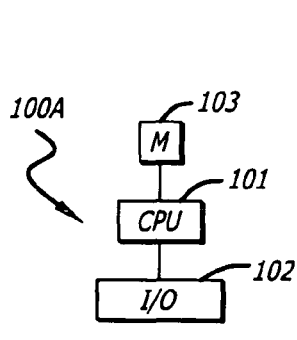
FIG. 1A illustrates a block diagram of a typical computer system in which embodiments of the invention may be utilized.

In the following detailed description of embodiments of the invention, numerous specific details are set forth in order to provide a thorough understanding of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Generally the embodiments of the invention provide a data merge feature, referred to as a Northbound Data Merge (NBDM), that replaces parts of the data on a high speed link with its own data, on the fly. That is, the embodiments of the invention replace part of the incoming serial data traffic (e.g., "idle packets or frames") over a serial data link with its local data, without having internal core logic process (e.g., serial-to-parallel conversion, assemblage into frames, and depacketize/deinterleave data) the incoming serial data traffic to determine where to insert the local data and retransmit the incoming data traffic with the local data inserted therein.

Previously, the incoming serial data had to be assembled into frames and received by the core logic in order to transmit local data. Without having to process the incoming serial data in order to transmit local data, an input/output (IO) interface of a memory module may simply retransmit the incoming serial data stream received from other memory modules or the memory controller over the serial data link, bypassing the internal core logic of a buffer integrated circuit. This can reduce data latency in the serial data stream. The portion of the serial data stream that is to be retransmitted is sometimes referred to as "Feed-thru Data" or "Feed-through data" (FTD).

Without any local data to transmit, the IO interface normally retransmits the received serial data stream, bypassing the core logic of the chip. When the core logic of the buffer memory chip needs to transmit local data, it sends a merge request along with the local data to the IO interface. Because the core clock that generates the local data is aligned during training to a frame clock of the high speed serial data link in the embodiments of the invention, the IO interface can readily merge the data at the appropriate frame boundary to replace an idle packet or frame.

Previously it was contemplated that the received serial data would be assembled into frames and received by the core logic and then re-transmitted on the outbound link. In this case, if the core logic had local data to send on the outbound link, it would then replace some of the incoming data with its own data, repacketize and serialize the data onto the outbound link. This would incur a data latency of at least two frames of data. The embodiments of the invention set up the merge timing during initial training so that the local data can be merged into the outbound link without having to receive and analyze the incoming data during normal operation in order to replace idle packets. The embodiments of the invention can reduce the data latency through the buffer memory integrated circuit from at least two frames of data down to a few bit intervals.

In one embodiment of the invention, an integrated circuit is provided that includes a serial input/output interface with one or more lanes. Each lane of the serial communication channel may include a first parallel-in-serial-output (PISO) shift register, a first multiplexer, and a serial transmitter coupled together.

The first parallel-in-serial-output (PISO) shift register has a parallel input coupled to a local data bus, a clock input coupled to a first clock signal, a load/shift-bar input coupled to a load signal. The first PISO shift register serializes parallel data on the local data bus into serialized local data on a first serial output.

The first multiplexer has a first data input coupled to the first serial output, a second data input to receive feed-through data, and a first select control input coupled to a local data select signal. The multiplexer selectively merges the serialized local data and the feed-through data into a serial data stream on a multiplexed output in response to the local data select signal.

The serial transmitter has an input coupled to the multiplexed output of the multiplexer to receive the serial data stream. The serial transmitter drives the serial data stream onto a serial data link.

The feed-through data may be two bits wide while the parallel input to the PISO shift register may be six bits wide and the serial output of the PISO shift register may be two bits wide. In this case, the first multiplexer may be a two bit bus multiplexer such that the serial data stream at the multiplexed output is two bits wide so that the serial transmitter receives a two bit serial data stream and serializes it onto the serial data link as a single bit serial data stream.

Each lane may further include a second multiplexer having a first input to receive resynchronized data, a second input to receive re-sampled data, and a select input coupled to a local clock mode signal. The second multiplexer to select between output the re-sampled data or the resynchronized data as the feed-through data in response to the local clock mode signal. Each lane may further include control logic coupled to the first multiplexer and the first PISO shift register. The control logic may include merge control logic and mode control logic. The control logic may receive the first clock signal and a merge enable signal to generate the local data select signal to merge the serialized local data and the feed-through data into the serial data stream in response to the merge enable signal and the first clock signal.

In another embodiment of the invention, a method for a memory module is provided including receiving an input serial data stream representing feed-through frames of data interspersed between idle frames of data; merging local frames of data and the feed-through frames of data together into an output serial data stream in response to a merge enable signal without decoding the input serial data stream; and transmitting the output serial data stream on a northbound data output to a next memory module or a memory controller. The local frames of data can be merged into the output serial data stream by replacing idle frames of data in the input serial data stream. In receiving the input serial data stream, sampling (also may be referred to as re-sampling) of the bits of data in the input serial data stream or re-synchronizing the bits of data in the input serial data stream may be provided. In merging of the local frames of data and the feed-through frames of data together, serializing parallel bits of the local frames of data into serial bits of data and multiplexing the serial bits of data of the local frames of data and serial bits of the feed-through frames of data into serial bits of the output serial data stream in response to the merge enable signal may be provided. A local frame of data may be selectively received in parallel over a local bus in six bit or twelve bit packets in response to a bus mode signal.

In another embodiment of the invention, a system is provided including: a processor, a memory controller coupled to the processor and at least one bank of memory coupled to the memory controller. The processor is provided to execute instruction and process data. The memory controller is provided to receive write memory instructions with write data from the processor and to receive read memory instructions from the processor and supply read data thereto.

The one bank of memory includes one or more memory modules each of which has a buffer integrated circuit and a random access memory integrated circuit coupled together. The buffer integrated circuit includes a southbound serial input/output interface with one or more serial lanes to receive the write data from the memory controller, and a northbound serial input/output interface with one or more serial lanes of a northbound serial input and a northbound serial output to transmit the read data to the memory controller.

Each serial lane in the northbound input/output interface has a parallel-to-serial converter and a first multiplexer. The parallel-to-serial converter has a parallel input coupled to parallel bits of a local data bus, a clock input coupled to a first clock signal, a load/shift-bar input coupled to a load signal. The parallel-to-serial converter serializes the parallel bits of data on the local data bus into serialized local data on a first serial output. The first multiplexer has a first data input coupled to the serial output of the parallel-to-serial converter, a second data input to receive serial feed-through data from the northbound serial input, and a select input coupled to a local data select signal. The first multiplexer to selectively merge the serialized local data and the serial feed-through data into a serial data stream on the northbound serial output in response to the local data select signal.

Each serial lane in the northbound serial input/output interface may further have a transmitter to drive the serial data stream onto the northbound serial data output towards the memory controller with an input coupled to the multiplexed output of the first multiplexer to receive the serial data stream, the transmitter.

Each serial lane of the northbound serial input/output interface may further include control logic coupled to the multiplexer and the first parallel-to-serial converter. The control logic to receive the first clock signal and a merge enable signal in order to generate the local data select signal and merge the serialized local data and the serial feed-through data into the serial data stream in response to the merge enable signal and the first clock signal.

For each bank of memory in the system, the memory controller includes a northbound serial input interface to receive one or more lanes of serial data from the one or more memory modules, and a southbound serial output interface to transmit one or more lanes of serial data to the one or more memory modules.

In another embodiment of the invention, a buffered memory module is provided including a printed circuit board, a plurality of random access memory (RAM) integrated circuits, and a buffer integrated circuit. The printed circuit board has an edge connection to couple to a receptacle of a host system. The plurality of random access memory (RAM) integrated circuits and the buffer integrated circuit are coupled to the printed circuit board. The buffer integrated circuit is electrically coupled to the plurality of RAM integrated circuits and the edge connection. The buffer integrated circuit has a southbound input/output interface and a northbound input/output interface with data merge logic having a plurality of merge logic slices for a plurality of lanes of serial data streams.

Each merge logic slice of the buffer integrated circuit includes a first parallel-in-serial-output (PISO) shift register and a first multiplexer. The first parallel-in-serial-output (PISO) shift register has a parallel input coupled to a local data bus, a clock input coupled to a first clock signal, a load/shift-bar input coupled to a first load signal. The first PISO shift register to serialize parallel data on the local data bus into serialized local data on a first serial output. The first multiplexer has a first data input coupled to the first serial output of the first PISO shift register, a second data input to receive serialized feed-through data, and a first select input coupled to a local data select signal. The first multiplexer selectively merges the serialized local data and the serialized feed-through data into a serial data stream on a multiplexed output in response to the local data select signal.

Each merge logic slice may further include control logic coupled to the first multiplexer and the first PISO shift register. The control logic receives the first clock signal and a merge enable signal to generate the local data select signal to merge the serialized local data and the serialized feed-through data into the serial data stream in response to the merge enable signal and the first clock signal.

The northbound input/output interface of the buffer integrated circuit in the buffered memory module may further include a plurality of transmitters each having an input coupled to a corresponding output of the first multiplexer in each merge logic slice, the plurality of transmitters to receive the serial data stream and drive it onto a serial data link.

In another embodiment of the invention, a memory system is provided including a plurality of buffered memory modules daisy chained together to form a bank of memory. Each buffered memory module includes a plurality of memory integrated circuits, and a buffer integrated circuit coupled to the plurality of memory integrated circuits. The buffer integrated circuit includes a southbound input/output serial interface to receive and retransmit southbound serial data from a memory controller or a prior buffered memory module to a next buffered memory module, a northbound input/output serial interface to receive northbound serial data from at least one buffered memory module as serialized feed-through data and retransmit it out towards the memory controller, a write data first-in-first-out (FIFO) buffer to store write data from the southbound input/output serial interface addressed to the buffered memory module by a write command, memory input/output interface to transfer write data stored in the write data FIFO buffer into at least one of the plurality of memory integrated circuits and to transfer read data from at least one of the plurality of memory integrated circuits into a read data FIFO buffer, and the read data FIFO buffer to store read data from at least one of the plurality of memory integrated circuits as the local data addressed from the buffered memory module by a read command.

The northbound input/output serial interface serializes the local data from the plurality of memory integrate circuits and merges it into a northbound serial data stream with the serialized feed-through data on a timing basis without decoding the received northbound serial data. The northbound input/output serial interface of includes a third FIFO buffer, data merge logic coupled to the third FIFO buffer, and a plurality of transmitters coupled to the data merge logic.

The data merge logic has a plurality of merge logic slices each including a first parallel-in-serial-output (PISO) shift register to serialize parallel data on the local data bus into serialized local data on a first serial output, and a first multiplexer to selectively merge serialized local data and serialized feed-through data into a serial data stream on a multiplexed output in response to the local data select signal. The PISO shift register has a parallel input coupled to a local data bus, a clock input coupled to a first clock signal, and a load/shift-bar input coupled to a first load signal. The first multiplexer having a first data input coupled to the first serial output of the first PISO shift register, a second data input to receive serialized feed-through data, a first select input coupled to a local data select signal, the first multiplexer.

Each of the plurality of transmitters has an input coupled to a corresponding output of the first multiplexer in each merge logic slice. The plurality of transmitters receive data from the serial data stream and drive it onto a serial data link.

In the memory system, each merge logic slice of the data merge logic may further include control logic coupled to the first multiplexer and the first PISO shift register to receive the first clock signal and a merge enable signal and generate the local data select signal to merge the serialized local data and the serialized feed-through data into the serial data stream.

The memory system may further include a memory controller coupled to at least one of the plurality of buffered memory modules. The memory controller has a southbound output serial interface to transmit the southbound serial data stream to the at least one of the plurality of buffered memory modules and a northbound input serial interface to receive the northbound serial data stream from the least one of the plurality of buffered memory modules.

Referring now to FIG. 1A, a block diagram of a typical computer system 100 in which embodiments of the invention may be utilized is illustrated. The computer system 100A includes a central processing unit (CPU) 101; input/output devices (I/O) 102 such as keyboard, modem, printer, external storage devices and the like; and monitoring devices (M) 103, such as a CRT or graphics display. The monitoring devices (M) 103 may provide computer information in a human intelligible format such as visual or audio formats. The system 100 may be a number of different electronic systems other than a computer system.

Figure 1B:
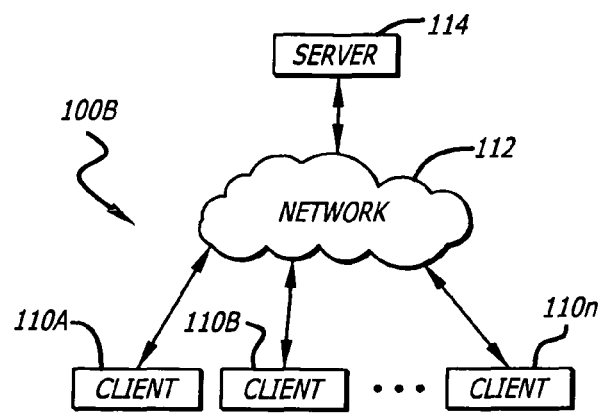
FIG. 1B illustrates a block diagram of a client-server system in which embodiments of the invention may be utilized.

Referring now to FIG. 1B, a client server system 100B in which embodiments of the invention may be utilized is illustrated. The client server system 100B includes one or more clients 110A-110M coupled to a network 112 and a server 114 coupled to the network 112. The clients 110A-110M communicate with the server 114 through the network 112 in order to transmit or receive information and gain access to any database and/or application software that may be needed on the server. The server 114 has a central processing unit with memory and may further include one or more disk drive storage devices. The server 114 may be used in a storage area network (SAN) as a network attached storage (NAS) device, for example, and have an array of disks. The data access to the server 114 is shared over the network 112 with the multiple clients 110A-110C.

Figure 2A:
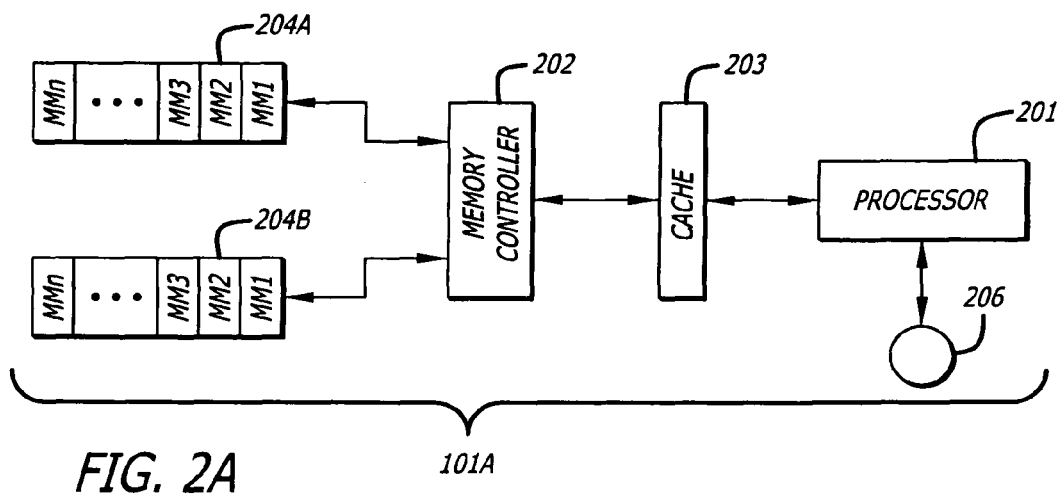
FIG. 2A illustrates a block diagram of a central processing unit in which embodiments of the invention may be utilized.

Referring now to FIG. 2A, a block diagram of a central processing unit 101A in which embodiments of the invention may be utilized is illustrated. The central processing unit 101A includes a processor 201, a memory controller 202, and a first memory 204A of a first memory channel coupled together as shown and illustrated. The central processing unit 101A may further include a cache memory 203, coupled between the memory controller 202 and the processor 201 and a disk storage device 206 coupled to the processor 201. The central processing unit 101A may further include a second memory channel with a second memory 204B coupled to the memory controller 202. As illustrated by the central processing unit 101A, the memory controller 202 and the cache memory 203 may be external to the processor 201.

Figure 2B:
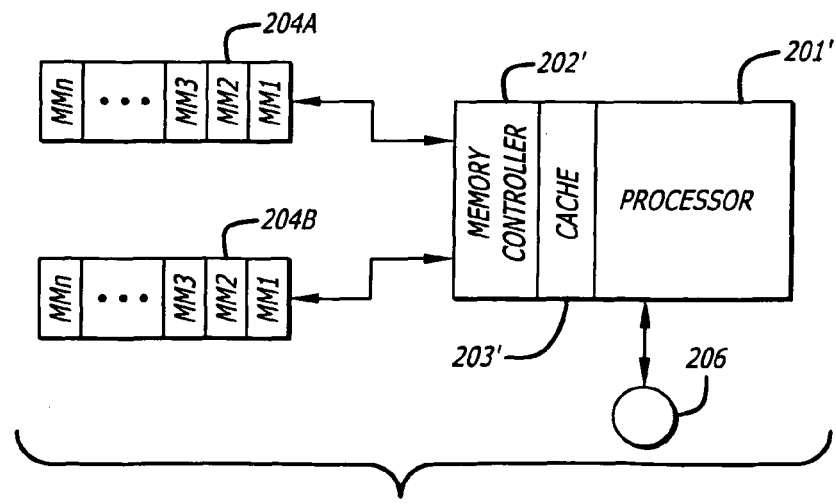
FIG. 2B illustrates a block diagram of another central processing unit in which embodiments of the invention may be utilized.

Referring now to FIG. 2B, a block diagram of another central processing unit 101B in which embodiments of the invention may be utilized is illustrated. The central processing unit 101B includes a processor 201' with an internal memory controller 202' and a first memory channel with a memory 204A coupled to the internal memory controller 202' of the processor 201'. The processor 201' may further include an internal cache memory 203'. The central processing unit 101B may further include a second memory 204B for a second memory channel, and a disk storage device 206 coupled to the processor 201'.

The disk storage device 206 may be a floppy disk, zip disk, DVD disk, hard disk, rewritable optical disk, flash memory or other non-volatile storage device.

The processor 201,201' may further include one or more execution units and one or more levels of cache memory. Other levels of cache memory may be external to the processor and interface to the memory controller. The processor, the one or more execution units, or the one or more levels of cache memory may read or write data (including instructions) through the memory controller with the memory 204A-204B. In interfacing to the memory controller 202,202', there may be address, data, control and clocking signals coupled to the memory as part of the memory interface. The processors 201,201' and the disk storage device 206 may both read and write information into the memories 204A,204B.

Each of the memories 204A and 204B illustrated in FIGS. 2A-2B may include one or more buffered memory modules (MM1-MMn), such as a fully buffered (FB) dual in-line memory module (DIMM), (FBDIMM), or a fully buffered (FB) single in-line memory module (SIMM), (FBSIMM), for example.

The memory controller 202,202' interfaces to each memory 204A-240B. In one embodiment of the invention, the memory controller 202,202' particularly interfaces to a buffer (not shown in FIGS. 2A-2B, but see buffer 450A in FIG. 5) in a first buffered memory module MM1 of each memory 204A-204B. With the memory controller 202,202' interfacing to the buffers of the memory modules, direct interface to the memory devices of the buffered memory modules (MM1-MMn) can be avoided. In this manner, different types of memory devices may be used to provide memory storage while the interface between the buffer and the memory controller can remain consistent.

Figure 3:
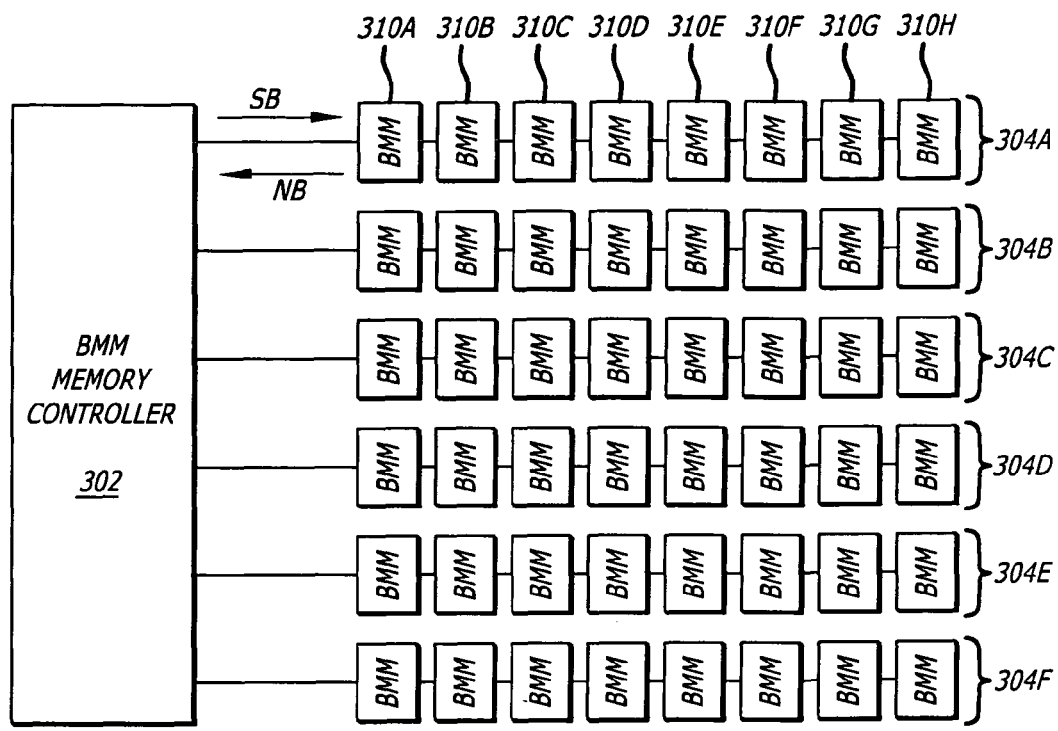
FIG. 3 illustrates a simplified block diagram of a buffered memory controller to couple data into and out of banks of buffered memory modules.

Referring now to FIG. 3, a buffered memory module (BMM) memory controller (BMMMC) 302 coupled to one or more memory banks 304A-304F (generally referred to as memory bank 304 or memory banks 304) is illustrated. The memory controller 302 can support more than two channels of memory and more than two memory banks of memory modules. Each memory bank 304 is made up of a plurality of buffered memory modules 310A-310H coupled together in a serial chain. This serial chain of buffered memory modules 310A-310H is also sometimes referred to as a daisy chain. Adjacent memory modules are coupled to each other, sometimes referred to as being daisy-chained together, such as memory module 310A being coupled to adjacent memory module 310B, for example.

Each of the memory modules 310A-310H in each bank bidirectionally communicate in a serial fashion with the memory controller 302 along the serial chain of memory modules 310A-310H. There is a southbound serial data link (SB) from the memory controller 302 to each memory bank 304 that may also be referred to as an outbound data link with outbound commands (e.g., read and write) and data. All write data from the memory controller that is to be written into the memory modules is sent over the southbound serial data link. There is a northbound serial data link (NB) from each memory bank 304 to the memory controller 302 that may also be referred to as an inbound data link with inbound data. All read data from the memory modules is sent to the memory controller over the northbound serial data link.

In the southbound serial data link (SB), data out from the memory controller 302 to a memory bank 304 is first coupled to the first memory module 310A which can read the data and pass it to memory module 310B. Memory module 310B can read the data and pass it to the next memory module in the serial chain, and so on and so forth until the last memory module in the southbound serial chain is reached. The last memory module in the southbound serial chain, memory module 310H, has no further memory module to pass data to and so the southbound serial data link terminates.

In the northbound serial data link (NB), data is serially communicated in a direction from the memory bank 304 to the memory controller 302. Each memory module in each memory bank communicates back towards the memory controller on the northbound serial data link (NB). Memory module 310H begins a serial chain of memory modules passing data towards the memory controller. Serial data transmitted by memory module 310H passes through or is otherwise retransmitted by memory module 310G. While memory module 310G may pass or retransmit the serial data from the prior memory module 310H, it may also add or merge its own local data to the northbound serial data stream heading to the memory controller 302. Similarly, each memory module down the chain passes or retransmits the serial data from the prior memory module and may add or merge their own local data to the northbound serial data stream heading to the memory controller 302. The last memory module in the northbound serial chain, memory module 310A, transmits the final northbound serial data stream to the memory controller 302.

The northbound and southbound serial data links may be considered as providing point to point communication from one memory module to another memory module and so on and so forth along the serial chain. The serial data flow from the memory controller 302 out to memory module 310A through memory module 310H may be referred to as a south data flow. The serial data flow from memory module 310H through memory module 310Z to the memory controller 302 may be referred to as a northbound data flow. In FIG. 3, the southbound data flow is illustrated by an arrow labeled SB, while the northbound data flow is illustrated by an arrow labeled NB.

Figure 4:
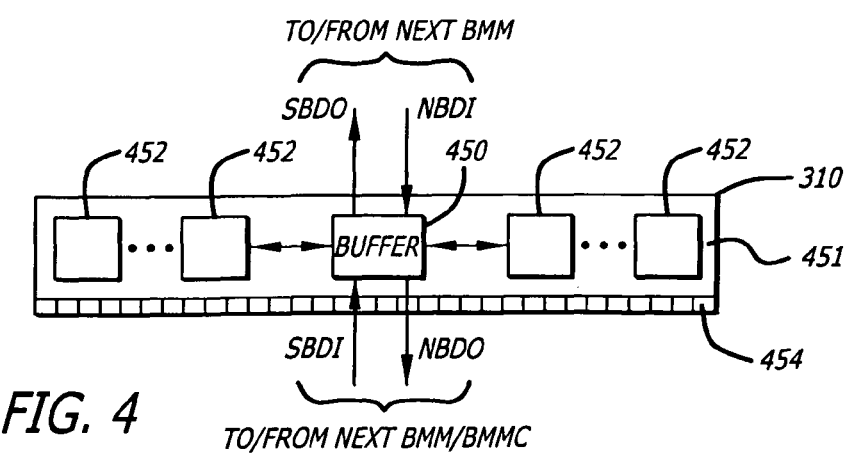
FIG. 4 illustrates a block diagram of a buffered memory module including a buffer that may merge data with feed through data.

Referring now to FIG. 4, a buffered memory module (BMM) 310 is illustrated that is exemplary of the memory modules 310A-310H. The buffered memory module 310 may be of any type such as a SIMM or DIMM, for example. The buffered memory module 310 includes a buffer integrated circuit chip ("buffer") 450 and memory integrated circuit chips ("memory devices") 452 coupled to a printed circuit board 451. Printed circuit board 451 includes an edge connector or edge connection 454 that couples to an edge connector of the host printed circuit board. A southbound data input (SBDI) and a northbound data output (NBDO) of the memory module 310 is respectively received from or transmitted to a prior buffered memory module or the buffered memory controller. A northbound data input (NBDI) and a southbound data output (SBDO) of the memory module 310 is respectively received from or transmitted to a next buffered memory module, if any.

Referring now to both FIGS. 3 and 4, the memory controller 302 communicates with the buffers 450 of each memory module 310A-310H in each memory bank 304 by using the southbound data flow and the northbound data blow. The edge connection 454 of the first memory module being the closest to the memory controller in each bank, memory module 310A, couples the buffer 450 of each memory module 310A to the memory controller 302. Memory module 310A has no adjacent memory module in the northbound data flow path. The northbound data flow from memory module 310A is coupled to the memory controller 302. The adjacent memory module 310A-310H in each bank are coupled together so that data can be read, written, and passed through each buffer 450 of each memory module. The last memory module being the furthest from the memory controller in each bank, memory module 310H, has no adjacent memory module in the southbound data flow path. Thus, memory module 310H does not pass southbound data flow further along the serial chain of memory modules.

The memory controller 302 does not directly couple to the memory devices 452 in any memory module. The buffer 450 in each memory module 310A-310H in each memory bank 304 couples directly to the memory devices 452 on the printed circuit board 351. The buffer 450 provides data buffering to all the memory integrated circuit chips or devices 452 on the same printed circuit board 451 of the memory module 310. The buffer 450 further performs serial to parallel conversion and parallel to serial conversion of the data, as well as interleaving/deinterleaving and packetizing/depacketizing of data as needed. The buffer 450 also controls its portion of the serial chain of the northbound and southbound data links with adjacent memory modules. Additionally, in the case of the first memory module, memory module 310A, the buffer 450 also controls its portion of the serial chain of the northbound and southbound data links with the memory controller 302. Additionally, in the case of the last memory module, memory module 310H, the buffer 450 also controls the initialization of the serial chain of memory modules and the generation of idle frames or idle packets of data in the northbound data link and northbound data flow to the memory controller 302.

Without a direct coupling between the memory controller 302 and the memory devices 452 of the memory modules, the memory chips or devices 452 may be of different types, speeds, sizes, etc. to which the buffer 450 may communicate. This allows improved memory chips to be used in a memory module without needing to update the hardware interface between the memory controller and the memory modules by purchasing a new host or motherboard printed circuit board. The memory module that plugs into the host or motherboard printed circuit board is updated instead. In one embodiment of the invention, the memory chips, integrated circuits, or devices 452 are DDR memory chips with dynamic random access memory (DRAM). Otherwise, in other embodiments of the invention, the memory chips, integrated circuits, or devices 452 can be any other type of memory or storage device.

Figure 5:
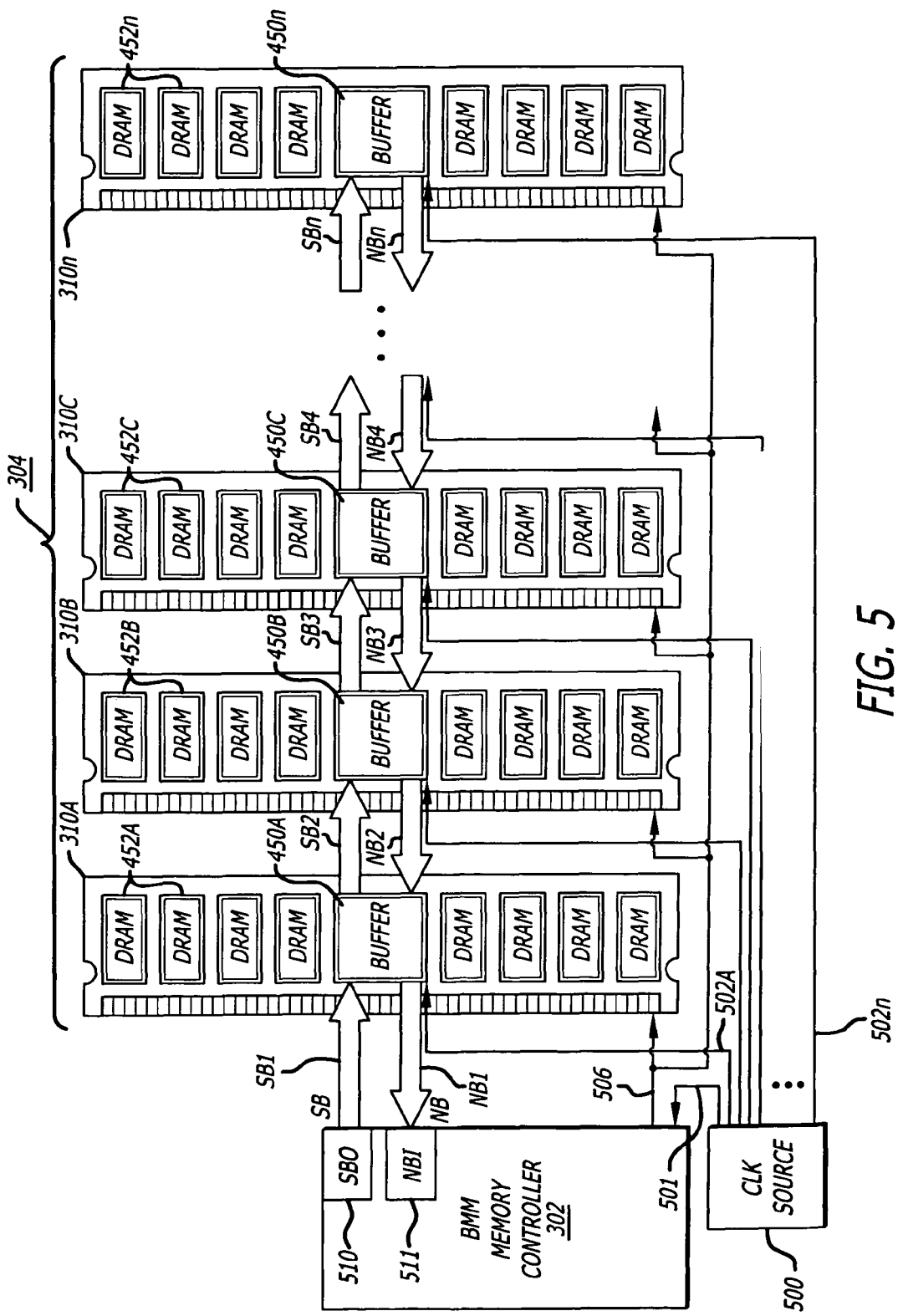
FIG. 5 illustrates a detailed block diagram of a buffered memory controller coupling to a bank of buffered memory modules.

Referring now to FIG. 5, one memory bank 304 of the memory banks 304A-304F of a memory system is illustrated in greater detail coupled to the buffered memory module (BMM) memory controller 302. In one embodiment of the invention, the BMM memory controller 302 is a fully buffered dual inline (FBD) memory controller and each of the memory modules 310A-310H is a fully buffered dual inline (FBD) memory module (FBDIMM). The memory bank 304 includes one or more memory modules 310A-310$n$ daisy chained together. Each memory module 310 functions like a repeater for the valid data flowing in the serial bit streams along the northbound data link (NB) and the southbound data link (SB).

Each memory module 310A-310$n$ in the memory bank 304 includes a buffer 450A-450$n$, respectively. Each buffered memory module 310A-310N respectively includes memory devices 452A-452N which may differ from each other. For example, the memory devices 452A in buffered memory module 310A may differ from the memory devices 452B in buffered memory module 310B. That is, the buffer 450 in each memory module makes the type of memory used for the memory device transparent from the memory controller 302.

The buffer 450 in each memory module functions like a repeater for the data flowing in the serial bit streams along the northbound data link (NB) and the southbound data link (SB). Additionally, the buffer 450 in each memory module may insert or merge its own local data into lanes of serial bit streams flowing along the northbound data link (NB) in place of frames or partial frames of idle or invalid data.

In order to synchronize the timing of the memory controller 302 and the memory modules 310A-310$n$ together in the memory bank 304, a clock generator 500 is provided that is coupled to each memory module and the memory controller. A clock signal 501 from the clock generator 500 is coupled to the memory controller 302. Clock signals 502A-502$n$ are respectively coupled to the buffers 450A-450$n$ in memory modules 310A-310$n$.

Memory controller 302 communicates through the memory modules in the memory bank 304 over the southbound data links SB1-SBn. Memory controller 302 may receive data from each memory module 310 within the memory bank 304 over the northbound data links NB1-NBn. The southbound data links SB1-SBn may consist of one or more lanes of serial data. Similarly, the northbound data links NB1-NBn may consist of one or more lanes of serial data. In one embodiment of the invention, there are fourteen lanes of serial data in the northbound data links NB1-NBn.

The last memory module, memory module 310$n$, regardless of whether or not it has data to send, generates a pseudorandom bit stream and starts it flowing towards the memory controller 302 on the northbound link NBn. The pseudorandom bit stream may be passed from one memory module to the next on the northbound links NB1-NBn. If the memory module 310$n$ has local data to send to the memory controller 302, it generates a frame of data including the local data and places it on the northbound link NBn instead of a frame of data of the pseudorandom bit stream. The pseudorandom bit stream may include a sequence of bits packetized into a frame of data that indicates an idle frame of data. An idle frame of data may be replaced by the other memory modules further down the line (memory modules 310A-3109$n$-1) in order to merge a frame of local data into the serial bit stream flowing on the northbound links NB1-NBn. For example, memory module 310B may receive an idle frame on the incoming northbound link NB3 and merge a frame of local data in place of the idle frame into the serial bit stream on the outgoing northbound link NB2.

The memory system illustrated in FIG. 5 may further include an SM bus (SMBus) 506 coupled from the memory control 302 to each of the memory modules 310A-310N. The SM bus 506 may be a serial data bus. The SM Bus 506 is a sideband mechanism to access internal registers of the buffer. Certain link parameters may be set up by a BIOS in the buffer before brining up the northbound and southbound serial data links. The SM-Bus may also be used to debug the system through access to the internal registers of the buffer.

The memory controller 302 may be a part of a processor (as illustrated by processor 201' and memory controller 202' in FIG. 2B) or may be a separate integrated circuit (as illustrated by processor 201 and memory controller 202 in FIG. 2A). In either case, the memory controller 302 can receive write memory instructions with write data from the processor and receive read memory instructions from the processor and supply read data to the processor in order to respective write or read data to or from memory. The memory controller 302 may include a southbound serial output interface (SBO) 510 to transmit one or more lanes of serial data to the one or more memory modules in each bank of memory. The memory controller 302 may further include a northbound serial input interface (NBI) 511 to receive one or more lanes of serial data from the one or more memory modules in each bank of memory.

Figures 1, 6:
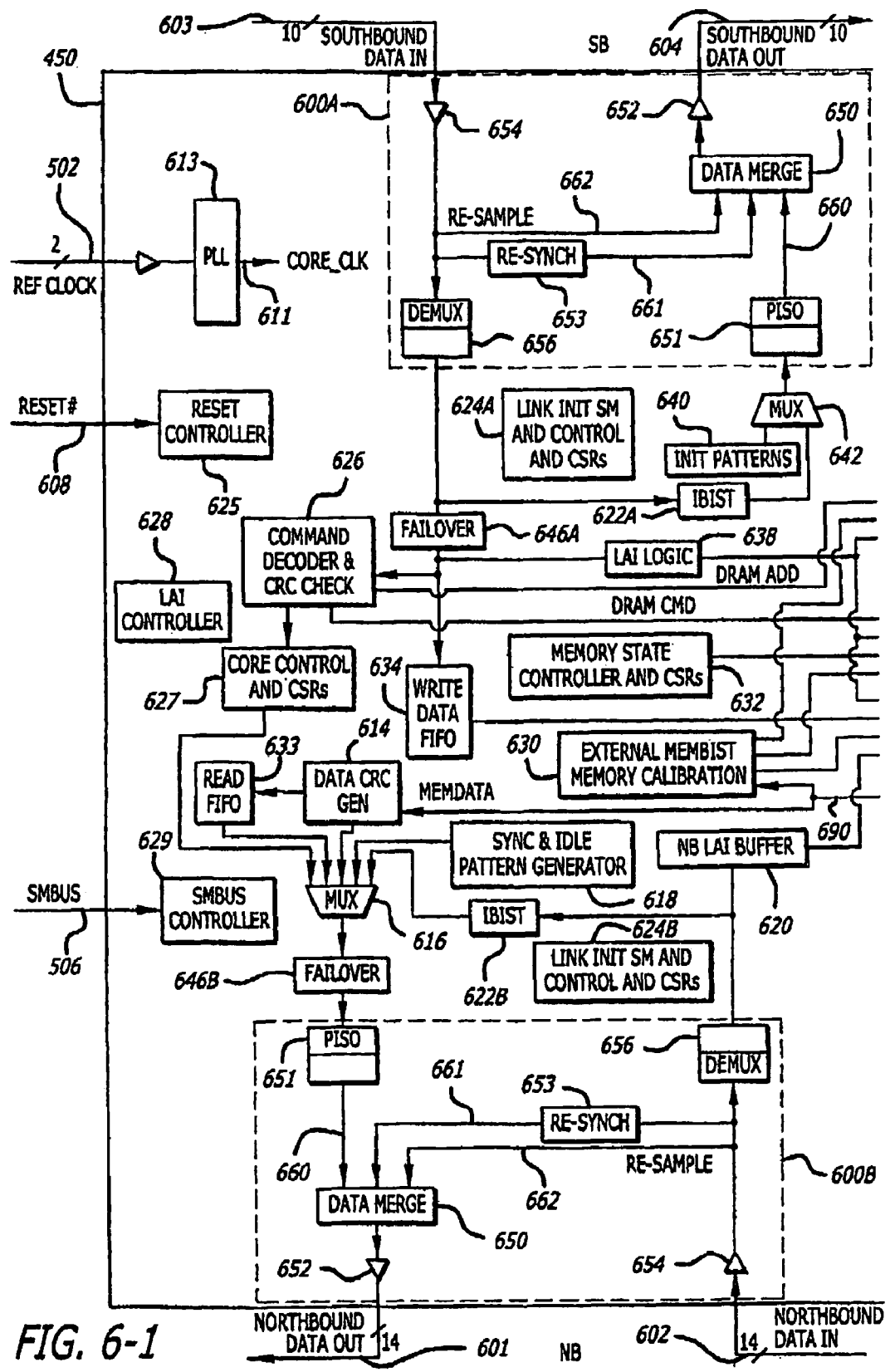
FIG. 6 (FIGS. 6-1 and 6-2) illustrates a functional block diagram of a buffer of a buffered memory module.
Figures 2, 6:
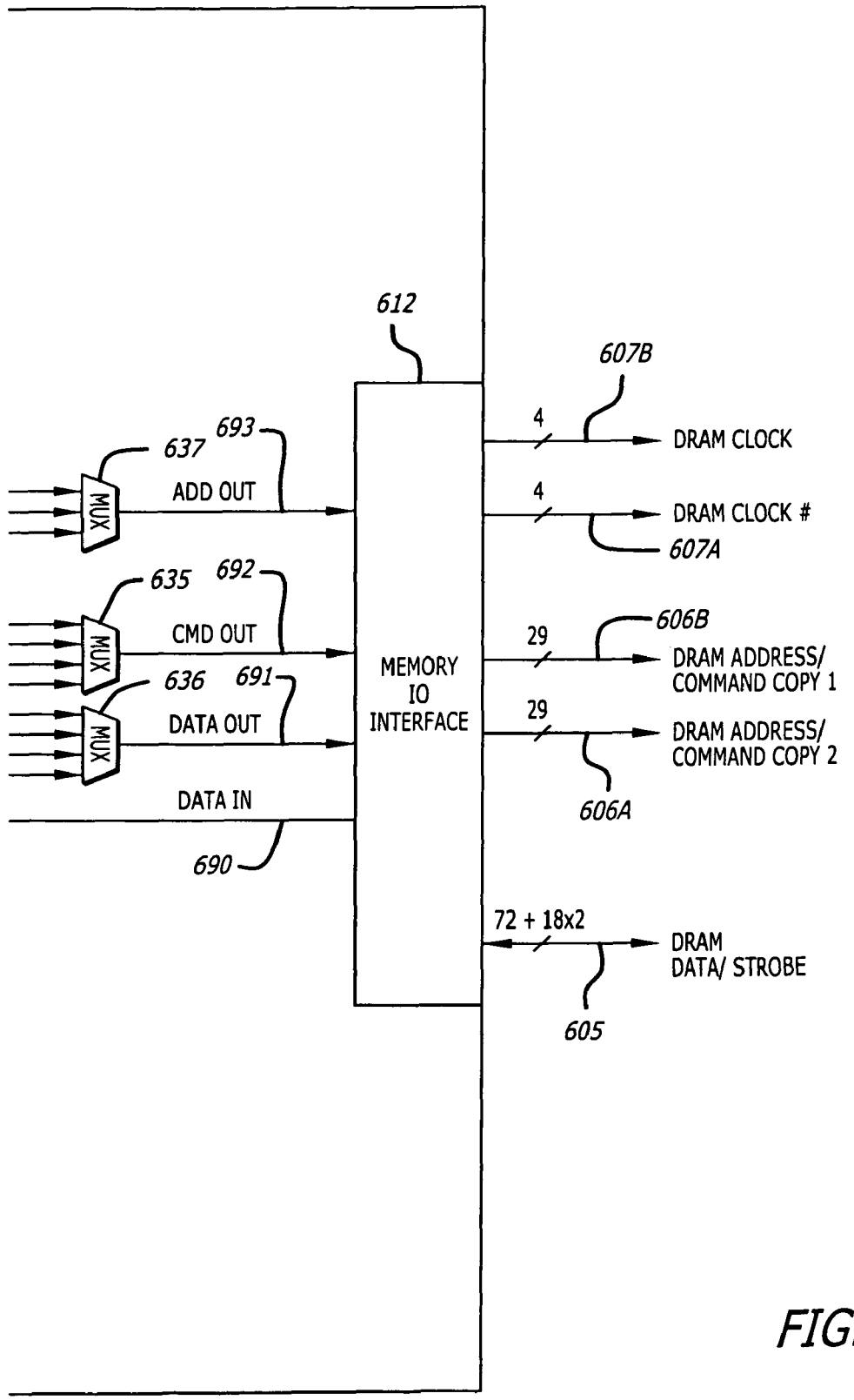

Referring now to FIG. 6 (FIGS. 6-1 and 6-2), a functional block diagram of the buffer 450 for the buffered memory module 310 is illustrated. Buffer 450 is an integrated circuit that can be mounted to the printed circuit board 451 of the buffered memory module 310. To couple data into and out of buffered memory module 310, buffer 450 includes a southbound buffer I/O interface 600A and a northbound buffer I/O interface 600B.

The northbound buffer I/O interface 600B interfaces to the northbound data out (NBDO) 601 and the northbound data in (NBDI) 602. The southbound buffer I/O interface 600A interfaces to the southbound data in (SBDI) 603 and the southbound data out (SBDO) 604. Northbound data in 602 and the northbound data out 601 includes fourteen lanes of a serial data stream in one embodiment of the invention. The southbound data in 603 and the southbound data out 604 includes ten lanes of serial data streams in one embodiment of the invention.

To interface to the memory devices 452, buffer 450 includes a memory I/O interface 612. At the memory I/O interface 612, DRAM data is bidirectionally passed over a DRAM DATA/STROBE bus 605 while addresses and commands are sent out over DRAM ADDRESS/COMMAND buses 606A-606B to the memory devices. Memory devices 452 are clocked by the DRAM clock buses 607A-607B in order to synchronize data transfer with the memory I/O interface 612. From the core logic of the buffer 450, the memory I/O interface 612 receives commands over the CMD OUT bus 692 from the multiplexer 635; addresses over the ADD OUT bus 693 from the multiplexer 637; and write data over the DATA OUT bus 691 from the multiplexer 636. The write data on the DATA OUT bus 691 is communicated to the appropriate memory devices over the DRAM DATA/STROBE bus 605. Address data on the DATA OUT bus 691 is communicated to the appropriate memory devices over the DRAM ADDRESS/COMMAND buses 606A-606B. The commands on the CMD OUT bus 692 is communicated to the appropriate memory devices over the DRAM ADDRESS/COMMAND buses 606A-606B.

In order to generate the core_clock signal 611 for the functional blocks of the buffer 450, it receives a reference clock (REF CLOCK) 502 that is coupled into a phase lock loop (PLL) 613. The reference clock (REF CLOCK) 502 may be a differential input signal and appropriately received by a differential input receiver. Buffer 450 further receives an SM bus 506 coupled to an SM bus controller 629. A reset signal (Reset#) 608 is coupled into a reset control block 628 in order to reset the buffer 450 and the functional blocks when it goes active low.

Between the memory I/O interface 612 and the buffer I/O interfaces 600A-600B is the core logic of the buffer 450. The core logic of the buffer 450 is used to read data out from the memory devices and drive it out as local data through the northbound data interface 600B. Additionally, any other response from a memory module is driven out by the buffer and into the northbound serial data stream through the northbound data interface 600B. The core logic of the buffer 450 is also used to write data into the memory devices that is received from the southbound data interface 600A. The commands to read and write data are received from the southbound data interface 600A. If the memory devices 452 of the given buffered memory module 310 are not to be accessed, serial data on the northbound data input 602 and the southbound data input 603 may pass through the buffer I/O interface 600A-600B onto the northbound data output 601 and the southbound data output 604, respectively. In this manner, data from another buffered memory module 310 will be passed through to the memory controller on the northbound data interface 600B without having to be processed by the core logic of the buffer 450. Similarly, data from the memory controller may be passed on to another memory module on the southbound data interface 600A without having to be processed by the core logic of the buffer 450.

The core logic of the buffer 450 includes functional blocks to read data from and write data into the memory devices 452. The core logic of the buffer 450 includes a phase lock loop (PLL) 613, a data CRC generator 614, a read FIFO buffer 6633, a five into one bus multiplexer 616, a sync and idle pattern generator 618, a NB LAI buffer 620, an integrated built in self-tester for the link (IBIST) 622B, a link initialization SM and control and configuration status registers (CSRs) 624B, a reset controller 625, a core control and configuration status registers (CSRs) block 627, an LAI controller block 628, an SMbus controller 629, an external MEMBIST memory calibration block 630, and a failover block 646B coupled together as shown in FIG. 6. The core logic of the buffer 450 may further include a command decoder and CRC checker block 626, an idle built in self-tester (IBIST) block 622A, a link initialization SM and control and CSRs block 624A, a memory state controller and CSRs 632, a write data FIFO buffer 634, a four into one bus multiplexer 635, a four into one bus multiplexer 636, a three into one bus multiplexer 637, an LAI logic block 638, an initialization patterns block 640, a two into one bus multiplexer 642, and a failover block 646A coupled together as shown in FIG. 6.

A multiplexer includes at least two data inputs, an output, and at least one control or select input to select the data input that is to be provided at the output of the multiplexer. For a two input multiplexer, one control or select input is used to select the data that is output at the multiplexer. A bus multiplexer receives a plurality of bits at each data input and has an output with a plurality of bits as well. A two into one bus multiplexer has two buses as its data input and a single bus output. A three into one bus multiplexer has three buses as its data input and a single bus output. A four into one bus multiplexer has four buses as its data input and a single bus output.

Within the buffer 450, each of the buffer I/O interfaces 600A-600B includes a FIFO buffer 651, data merge logic 650, a transmitter 652, a receiver 654, a re-synchronization block 653, and a demultiplexer/serial parallel converter block 656. Data can pass through each of the buffer I/O interfaces 600A-600B through a resynchronization path 661 or a/re-sample path 662 without interfacing to the core logic. Through the embodiments of the invention, local data associated with the buffer 450 can be merged into the serial data stream to overwrite an idle frame without having the core logic receive a serial data stream and determine where the idle frames are located there-in.

The multiplexer 616 selects what data is directed towards the FIFO buffer 651 of the northbound buffer I/O interface 600B for driving out as local data on the serial lanes of the northbound data output 601. Generally, the multiplexer 616 may select status or other control information from the core control and CSR block 627, read data from the read FIFO buffer 633, read data with attached CRC data from the CRC generator 614, synchronization or idle patterns from the pattern generator 618, or test pattern data from the IBIST block 622B.

The multiplexer 642 selects what data is directed towards the FIFO buffer 651 of the southbound buffer I/O interface 600A for driving out on the serial lanes of the southbound data output 604. Generally, the multiplexer 642 may select initialization patterns from the init patterns block 640 or test pattern data from the IBIST block 622A.

Figure 7A:
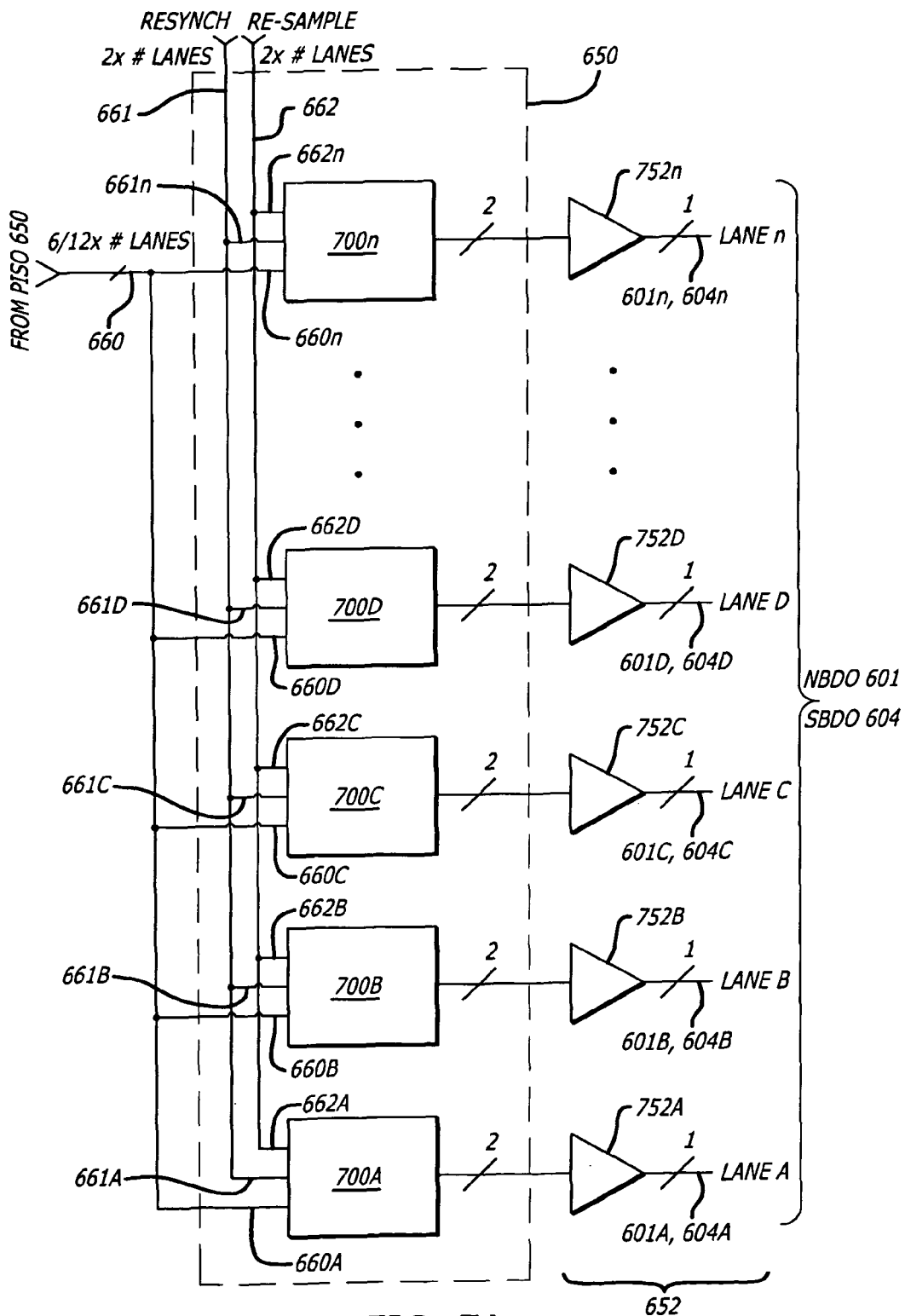
FIG. 7A illustrates a simplified block diagram of the data merge logic including lanes of data merge logic slices coupled to transmitters.

Referring now to FIG. 7A, a block diagram of the data merge logic 650 coupled to the transmitter 652 is illustrated. The transmitter 652 is made up of N lanes of transmitters 752A-752n. As discussed previously, in one embodiment of the invention the number of lanes is ten. In another embodiment of the invention, the number of lanes is fourteen. In the data merge logic 650 there is a data merge logic slice 700A-700n for each one of the N lanes.

A parallel local data bus 660 from the first-in-first-out (FIFO) buffer 651 couples into each data merge logic slice 700A-700n. Respective lanes of serial data of the re-synch bus 661 couple into each respective data merge logic slice 700A-700n. The bit width of the re-synch bus 661 is two times the number of lanes. Two bits of each respective lane of the re-synch bus 661 are coupled into each respective data merge logic slice 700A-700N. Respective lanes of serial data of the re-sample bus 662 couple into each respective data merge logic slice 700A-700n. The bit width of the re-sample bus 662 is two times the number of lanes. Two bits of each respective lane of the re-sample bus 662 are coupled into each respective data merge logic slice 700A-700N.

The re-sample bus 662 and the resynch bus 661 both transfer a two bit serial data stream for each lane into each respective data merge logic slice 700A-700N. In contrast, the parallel data bus 660 couples six or twelve bits for each lane into each respective data merge logic slice 700A-700N. The bit width of the parallel local data bus 660 is twelve times the number of lanes. However in a six-bit mode, only six bits of the twelve may be active per lane. The output from each of the data merge logic slices 700A-700N is a two bit serial data stream which is respectively coupled into the serial transmitters 752A-752N. Each serial transmitter 752 converts two parallel bits of serial data into a single bit serial data stream on the respective lane 601A-601N of the northbound data output (NBDO) 604 or the respective lane 604A-604N of the southbound data output (SBDO) 601 as shown in FIG. 7A.

Figure 7B:
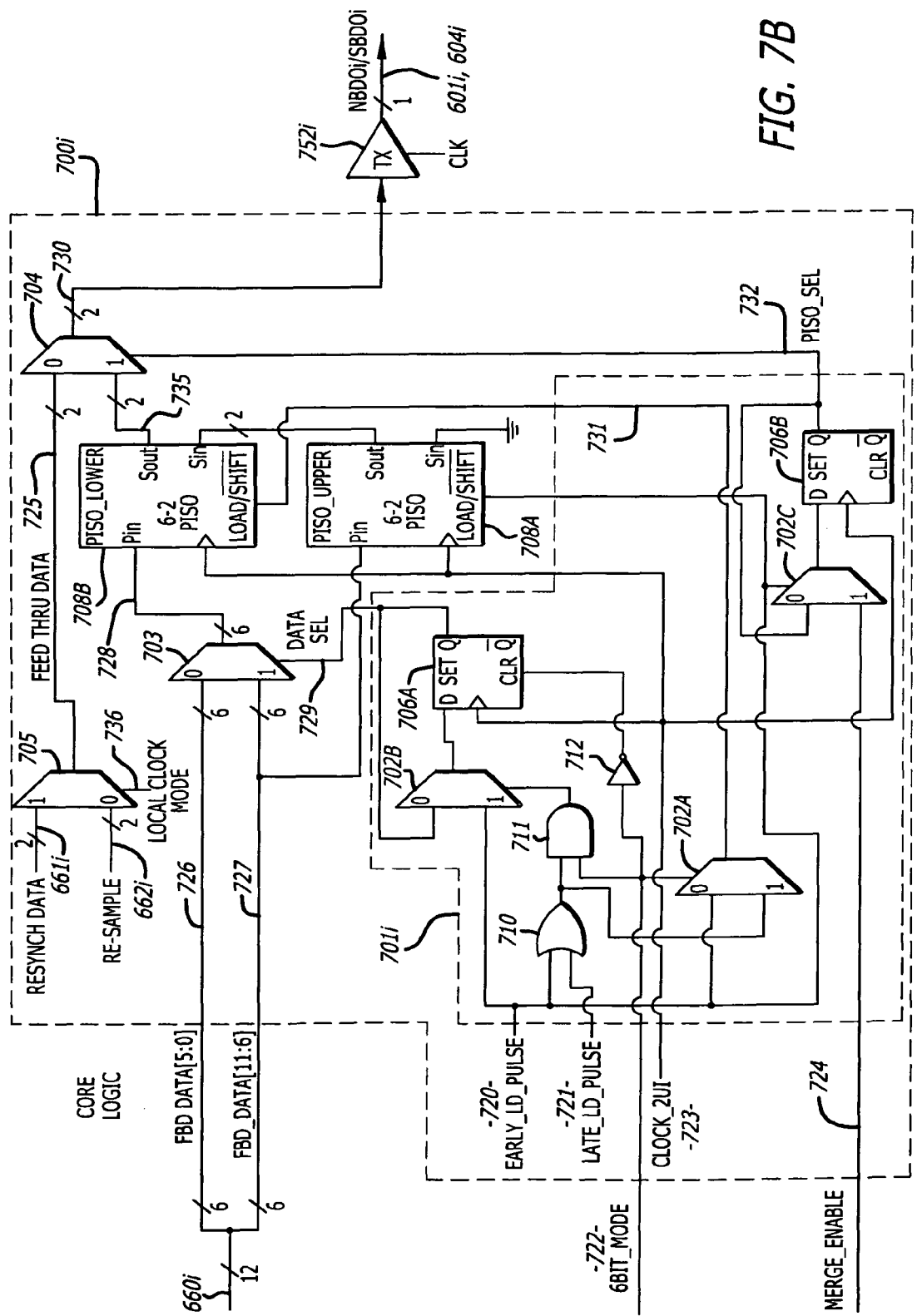
FIG. 7B illustrates a schematic diagram of a data merge logic slice for one lane of serial data.

Referring now to FIG. 7B, a schematic diagram of a data merge logic slice 700i is illustrated coupled to a transmitter 752i. The data merge logic slice 700i represents one of the data merge logic slices 700A-700n for each of the N lanes illustrated in FIG. 7A. The transmitter 752i represents one of the transmitters 752A-752n for each of the N lanes illustrated in FIG. 7A.

Each data merge logic slice 700i can operate in one of two bit width modes, a full frame mode of twelve bits width (also referred to as a 12 bit mode) or a half frame mode of six bits width (also referred to as a six-bit mode). A mode control signal (6bit_mode) 722 indicates and controls which of the two bit width modes the data merge logic slice 700i is to function with the core logic.

In the full frame mode or twelve bit mode, the core logic uses a full frame of twelve bits to communicate data over bus 660i with the data merge logic slice 700i. The lower six bits of bus 660i are represented by the Data[5:0] bus 726 while the upper six bits of bus 660i are represented by a Delayed_data [5:0] bus 727. The twelve bits of local data (Data[5:0] and Delayed_data[5:0]) that are to be merged into the serial data stream and transmitted are respectively latched into a lower parallel-in-serial-output (PISO) converter 708B and an upper parallel-in-serial-output (PISO) converter 708A at the beginning of the frame by an "Early_Load_Pulse" control signal 720.

The lower parallel-in-serial-output (PISO) converter 708B and the upper parallel-in-serial-output (PISO) converter 708A are parallel-in-serial-output (PISO) shift registers and may be also be referred to herein as such. Each of the PISO converters 708A-708B, also referred to as PISO shift registers 708A-708B, have a parallel data input, a clock input, a load/shift-bar input, a serial input (SIN), and a serial output (SO). The serial output of the upper PISO shift register 708A is coupled into the serial input of the lower PISO shift register 708B to support serializing twelve parallel bits of the local data bus 660i. The serial input of the upper PISO shift register 708A may be coupled to a logical low (e.g., ground) in one embodiment of the invention or a logical high (e.g., VDD) in another embodiment of the invention. The serial output (SOUT) of the PISO shift registers 708A-708B is two bits at a time in one embodiment of the invention. In another embodiment of the invention, the serial output (SOUT) of the PISO shift registers 708A-708B may be one bit at a time.

In the twelve bit mode, the six bits of bus 726 are coupled to the parallel data input (PIN) of the lower PISO shift register 708B while the six bits of bus 727 are coupled to the parallel data input (PIN) of the upper PISO shift register 708A. These twelve bits are respectively loaded into each PISO shift register during the early load pulse 720 with the mode control signal 722 indicating a twelve bit bus mode (e.g., mode control signal 722 indicates twelve bit mode by being a logical low level and a six-bit mode by being a logical high level in one embodiment of the invention). In the twelve bit mode, the clear input to D-type flip flop 706A is logically high setting the Q output of the D-type flip flop 706A to logical zero so that the control input to the multiplexer 703 selects the bus 726 to be output onto bus 728.

In the half frame mode or six-bit mode, the core logic only uses a half frame of six bits to communicate data over bus 660i with the data merge logic slice 700i at a time. The core logic sends six bits of data at a time or early data (Data[5:0] 726) and late data (Delayed_data[5:0]) offset by half of a frame. In the half frame mode, only the lower PISO shift register 708B of the data merge logic slice 700i is used to merge data into the serial data stream for transmission.

In the six-bit mode, the multiplexer 703 selectively couples the six bits of bus 726 to the parallel data input (PIN) of the lower PISO shift register 708B during the early load pulse 720 and the six bits of bus 727 to the parallel data input (PIN) of the lower PISO shift register 708B during the late load pulse 721. The six bits of bus 726 are loaded into the PISO shift register 708B during the late load pulse 721 with the mode control signal 722 indicating a six-bit bus mode. The six bits of bus 727 are loaded into the PISO shift register 708B during the early load pulse 720 with the mode control signal 722 indicating a six-bit bus mode.

The data merge slice 700i includes data path logic and control logic 701i. The data path logic selectively merges the local data and the feed-through data into the serial bit stream. The control logic 701i controls the data path logic in each data merge slice in order to properly synchronize the merging of local data and feed-through data into the serial bit stream.

The control logic 701i, with mode control logic and merge control logic, includes three single bit two to one multiplexers 702A-702C, set/reset D flip-flops 706A-706B, an OR gate 710, an AND gate 711, and an inverter 712 coupled together as shown and illustrated in FIG. 7B. The signals generated by the control logic 701i are coupled to the data path logic. The multiplexers 702A-702B, the D-type flip flop 706A, the OR gate 710, the AND gate 711, and the inverter 712 provides mode control logic. The multiplexer 702C and the D-type flip flop 706B provide merge control logic.

The data path logic includes a six-bit two to one bus multiplexer 703, two bit two-to-one bus multiplexers 704-705, and a pair of six-bit in/two bit out parallel in serial out (PISO) converters 708A-708B coupled together as shown and illustrated in FIG. 7B.

Each slice 700i of the data merge logic 650 may receive a two bit serial lane of resynch data 661i, a two bit serial lane of re-sample data 662i, and a twelve bit parallel lane of local data 660i. The parallel lane of local data 660i is from the core logic of the buffer 450 and may be various types of data. For example, the local data 660i may be read data from memory devices 452, cyclic redundancy check (CRC) data, test data, status data, or any other data that is to be received, transmitted, or generated by the core logic of the buffer.

The two bit lane of re-sync data 661i and the two bit lane of re-sample data 662i have no contact with the core logic of the given buffer 450 and are multiplexed into feed-through data (also referred to herein as "feedthru data") 725 by multiplexer 705 in response to a local clock mode signal 736. If the buffer 450 is operating in the local clock mode, the resynch data is multiplexed onto the feedthru data 725. If the buffer 450 is not operating in the local clock mode, the re-sample data 662i is multiplexed onto the feedthru data 725. In a local clock mode, a phase locked loop (PLL) clock generator is used to generate a local clock signal in the buffer that is used to resynchronize the input serial data stream to generate the re-synch data. If not in the local clock mode, a received clock is generated from and synchronized with the frames of data in the received serial data stream that is used to sample the input serial data stream to generate the re-sample data. The clock2UI signal 723 is switched between the locally generated clock signal and the received clock signal in response to the local clock mode signal 736. The source of the feedthru data 725 may be from the buffer 450 of another memory module 310 on the northbound (NB) side (also referred to as forwarded northbound data); or from the buffer 450 of another memory module 310 on the southbound (SB) side (also referred to as forwarded southbound data) or alternatively from the memory controller 302 on the southbound (SB) side.

The two to one bus multiplexer 704 receives the two bits of serial feedthru data 725 as a first input, a two bit serial output from the 6-2 PISO shift register 708B as a second input, and a local data select signal (PISO_SEL) 732 at its control input. The two bit serial output 735 from the 6-2 PISO shift register 708B is two serialized bits of local data 735 from the parallel data bus 660i. Thus in response to the local data select signal (PISO_SEL) 732, the multiplexer 704 either selects to output two bits of feedthru data 725 or two bits of serialized local data 735 from the parallel data bus 660i generated by the 6-2 PISO shift register 708B. The two bit output 730 from the multiplexer 704 is coupled to the transmitter 752 and further serialized into a single bit onto the lane NBDOi/SBDOi 601i, 604i. In this manner, local data from the core logic can be multiplexed with feed-through data and merged into a lane of the serial bit stream at NBDOi/SBDOi 601i, 604i.

The local data select signal (PISO_SEL) 732 that controls the merging of data into the serial bit stream is generated by the D flip-flop 706B. In response to a merge enable signal 724, the D flip-flop 706B generates the local data select signal (PISO_SEL) 732 on the rising edge of the clock signal Clock_2UI 723. The merge enable signal 724 is coupled into a first input of the multiplexer 702C. The local data select signal (PISO_SEL) 732 is fed back and coupled into a second input of the multiplexer 702C. The output of multiplexer 702C is coupled into the D input of the D flip-flop 706B. An early load pulse (EARLY_LD_PULSE) signal 720 is coupled into the select control input of the multiplexer 702C. If the early load pulse 720 is active high, the merge enable signal 724 is driven out by the multiplexer 702C and coupled into the D input of the D flip-flop 706B. If the early load pulse 720 is low, the local data select signal (PISO_SEL) 732 is fed back through the multiplexer 702C and coupled into the D input of D flip-flop 706B to retain the current state of the local data select signal (PISO_SEL) 732. As the early load pulse 720 is periodically clocked, if the merge enable signal 724 is low, it clears the D flip flop 706B so its Q output is a low logic level signal that terminates the merge of data at the appropriate time.

The merge enable signal 724 is synchronized into the local data select signal (PISO_SEL) 732 on the edge of the clock signal Clock_2UI 723. As the merge_enable signal 724 is sampled during the early_load_pulse 720 to generate the local data select signal (PISO_SEL) 732, the multiplexer 704 is switched on frame boundaries (12 bits of data per lane in a frame). If the merge enable signal 724 is active high on the rising edge of the clock signal Clock_2UI 723, the local data select signal (PISO_SEL) 732 goes active high to control the multiplexer 704 to select the two serialized bits of local data 735 as its two bit output 730. If the merge enable signal 724 is low on the rising edge of the clock signal Clock_2UI 723, the local data select signal (PISO_SEL) 732 remains low to control the multiplexer 704 to select the two feedthru bits of data 725 as its two bit output 730.

In response to the local data select signal (PISO_SEL) 732 being a logical high, the two serial bits in the parallel data bus 660i are to be merged into the lane NBDOi/SBDOi 601i, 604i. In response to the local data select signal (PISO_SEL) 732 being a logical low, the two bits of feedthru data 725 is selected by multiplexer 704 to be output onto the lane NBDOi/SBDOi 601i, 604i.

As the local data select signal (PISO_SEL) 732 is responsive to the merge enable signal 724, the generation of the merge enable signal 724 allows the parallel data of bus 660i to be merged onto the serial data stream of the lane NBDOi/SBDOi 601i, 604i. The merge enable signal 724 is generated by link control logic (in the link init SM and control and CSR functional block 624B illustrated in FIG. 6) in time to allow local data to be merged into the serial data stream at the appropriate time.

Referring momentarily back to FIG. 5, the timing of the merge enable signal is established for each memory module 310 during initialization and training of the system. Note that for the last memory module 310n in a bank 304, the merge enable signal is more of a data transmit signal as there are no further memory modules in the chain generating data in the northbound data link.

Referring now to FIG. 10, a flow chart is illustrated for the initialization, training, and functioning of the buffer in merging local data and feed through data together into a serial data stream output. The flow chart starts at block 1000.

At block 1002, the buffer in each memory module of each memory bank is initialized. During initialization of a memory bank 304, each memory module has its southbound and northbound serial data links initialized (may also be referred to as being part of link training). The memory controller 302 sends out an initialization pattern on the southbound (SB) data link SB1-SBn. During initialization, the buffer 450n in the last memory module 310n receives the initialization pattern on the southbound data link SBn and retransmits it back onto the northbound (NB) data link NB1-NBn through other memory modules back to the memory controller 302. As each buffer has its own clock, the initialization pattern received on the northbound (NB) data link NB1-NBn by the buffer is used for bit locking and frame alignment purposes in each lane of serial data. The clock in the buffer may be synchronized to the initialization pattern. The timing of logic may be aligned with the initialization pattern in order to receive packets of data in the serial data stream as well as parse a header from a frame of data and any error correction/detection or other data fields within a packet. The generation of the Early_Ld_Pulse 720 is set up to be coincident with the beginning of frames of data received by a given memory module. The generation of the Late_LD_Pulse 721 is set up to be at a half frame boundary of frames of data received by a given memory module.

Next at block 1004, each buffer in each memory module of each memory bank is trained. After sending out the initialization pattern, the memory controller 302 sends out a training pattern through to the last memory module 310n in a given bank 304 during training. During training, the buffer 450n in the last memory module 310n receives the training pattern on the southbound data link SBn and retransmits it back onto the northbound (NB) data link NB1-NBn through other memory modules back to the memory controller 302. Each memory module observes one of the training patterns on the southbound (SB) data link and determines the amount of time or clock cycles for it to return to the same memory module on the northbound (NB) data link. A roundtrip time is determined for a given position of each memory module.

Provided that the requests are not overly bunched together, the roundtrip time represents a slot in time where it is safe for a given memory module to merge data onto the northbound data link without colliding with valid data of another memory module. At a given memory module, an idle data packet is expected to be received at this point in time on the northbound data link after seeing a memory request command on the southbound data link. At this point in time, the idle data packet can be replaced by a local data packet. The roundtrip time and the command to data delay time for a given memory module are the basis for setting up the timing of the merge enable signal that is used to control the merging of local data into the northbound data link. If the roundtrip time is long, data can be fetched in advanced and placed in a FIFO buffer waiting for the proper moment to be merged into the northbound data stream. The distance between read and write FIFO buffer pointers in the northbound interface of the buffer can be set based on the roundtrip timing. The roundtrip time may be determined as a function of a whole number of periods of the bit rate clock, clock_2UI 723. The number of memory modules in a channel and the command to data delay of the last memory module in the channel determines the round-trip time for that channel.

A command to data delay for each memory module may be further determined to assist in establishing the timing of the merge enable signal in each memory module. The command to data delay timing may include one or more of the following time periods: the time for a command to be transferred from the southbound IO interface 600A to the memory IO interface 612; the time for the command to be transferred from the memory IO interface 612 to the memory devices 452; differences in clock timing for the memory IO interface 612 and the memory devices 452, routing delays in the clock signals and command signals to the memory devices 452; any set-up/hold times for the buffer 450 and the memory devices 452; the read latency in the memory devices 452 (e.g., CAS timing and any added latency); routing delays in the data signals and strobe signals from the memory devices 452 to the buffer 450; data delay skew between memory devices; delays through the memory IO interface 612, any set-up/hold times for the buffer 450 and the memory devices 452; and time for data to be transferred from the memory IO interface 612 to the northbound IO interface 600B (this may include buffering and clocking delays for data within the buffer 450). The command to data delay timing may be determined as a number of multiple of frames or a fraction there-of with a granularity of the delay time being as a function of a whole number of periods (bit times such as frame/12 or clock_2ui/2) of a bit rate clock. The command to data delay timing of a memory module, such as the last memory module 310n, can be programmatically increased by a register setting if additional delay time is desired.

Next at block 1006, after the initialization and training, each buffer is ready to receive an input serial data stream from a serial data input. However, the buffer in the last memory module 310n in the memory bank 304 either transmits idle packets or read requested data packets on the northbound data link towards the memory controller 302. Otherwise, an input serial data stream is received that represents feed-through frames of data interspersed between idle frames of data.

Next at block 1008, a determination may be made with respect to the availability of local data. If there is local data to merge into the serial data stream, then the control flow jumps to block 1010. If there is no local data to merge into the serial data stream, then the control flow jumps to block 1014.

At block 1014 with no local data to merge, the feed-through data is transmitted onto the serial data output. The feed-through data may have its bits of data in the input serial data stream re-sampled. Alternatively, feed-through data may have its bits of data in the input serial data stream resynchronized. Then the control flow jumps back to go to block 1006 to continuously receive the input serial data stream.

At block 1010 with local data to merge, frames of the local data replace the feed-through data in the output serial data stream. That is, if local data needs to be sent by a buffer, frames of data in the incoming serial data stream are dropped and frames of local data are sent in place thereof in response to the merge enable signal. The frames of the local data and the feed-through data may be merged together by serializing parallel bits of the local frames of data into serial bits of data and then multiplexing the serial bits of data of the local frames of data and the serial bits of the feed-through frames of data into serial bits of the output serial data stream in response to the merge enable signal. During initialization and training, the host and memory controller ensures that idle frames of data in the input serial data stream are replaced by local frames of data. The buffer does not need to check if the incoming frame in the input serial data stream that is being replaced is an idle frame of data or not.

At block 1012, the output serial data stream, including the merged data, is transmitted onto the serial data output to the next memory module up the chain or alternatively to the memory controller.

Next, the control process jumps back to block 1006 to continue receiving the input serial data stream from the serial data input.

As discussed previously, the local data from the core logic and the buffer 450 may be output in six bits, chunks or twelve bit chunks at a time. The mode control signal (6bit_mode) 722 determines whether the data merge logic slice 700*i* is to function in a six-bit mode (half frame mode) or a twelve bit mode (full frame mode). The mode control signal (6bit_mode) 722 is coupled into the selection or control input of the multiplexer 702A and a first input of the AND gate 711, and the input to the inverter 712.

The early load pulse signal 720 controls the loading of the first six bits on the parallel data bus 660*i*. A late load pulse signal 721 controls the loading of the second six bits on the parallel data bus 660*i*. A late load pulse 721 is coupled into a first input of the OR gate 710. The early load pulse control signal 720 is coupled into the first input of the multiplexer 702B, the second input of the OR gate 710, the first input of the multiplexer signal 702A, a load/shift-bar input of the 6-2 PISO shift register 708A, and the select input of the multiplexer 702C.

The clock signal Clock_2UI 723 couples into the clock inputs of the D flip-flops 706A-706B, and the clock inputs of the 6-2 PISO shift registers 708A-708B. The output of multiplexer 702A is coupled into the load/shift-bar input of the 6-2 PISO shift register 708B.

The parallel input of the 6-2 PISO shift register 708A is coupled to the six bit delayed data bus 727. The two bit serial output of the 6-2 PISO shift register 708A is coupled into the two bit serial input of the 6-2 PISO shift register 708B. The parallel input of the 6-2 PISO shift register 708B is coupled to the six-bit output from the multiplexer 703. In this manner when a data merge logical slice 700*i* is in a 12 bit mode, 12 bits of data can be loaded into the 6-2 PISO shift register 708A-708B and then shifted serially out from the 2 bit serial output 708B, through the multiplexer 704 and coupled into the transmitter 752*i*.

The serial transmitter 752*i* is double clocked by a clock signal in order to convert the 2 parallel bit sets into the serial single bit at its output 601*i*, 604*i*.

The data merge logical slice 700*i* is in a 12 bit mode when the 6bit_mode control signal 722 is a logical low. The data merge logical/700*i* is in a 6 bit mode when the 6 bit mode controls signal 722 is a logical high. Control logic 710-712 in conjunction with the multiplexer 702B and D flip-flop 706A generate a data bus select (Data_Sel) signal 729 which is coupled to the select input of the multiplexer 703 in order to establish a 12 bit mode or a 6 bit mode in response to the 6 bit mode control signal 722. When the data bus select signal 729 is logically low, 12 bits of data are to be loaded in parallel into the 6-2 PISO shift registers 708A-708B. When the data bus select signal 729 is a logical high, 6 bits of the data bus 727 are to be coupled into the 6-2 PISO shift register 708B.

In a 6 bit mode, either the early load pulse signal 720 or the late load pulse 721 can load parallel data into the 6-2 PISO shift register 708B. In either the 6 bit or 12 bit mode, the early load pulse 720 is only used to load parallel data from the data bus 727 into the 6-2 PISO shift register 708A.

The serial input of the 6-2 PISO shift register 708A is coupled to ground such that only zeros will be serially shifted in behind the data to be transmitted. Alternatively, the serial input of the 6-2 PISO shift register 708A may be connected to VDD such that only logical ones are serial shifted in behind the data being transmitted.

The Q output of D flip-flop 706A is coupled into the second input of the multiplexer 702B such that when the output of AND gate 711 is a logical row, the Q output couples into the D input of the D flip-flop 706A to retain the loaded logic state therein of the data bus select (DATA_SEL) signal 729.

Figure 8:
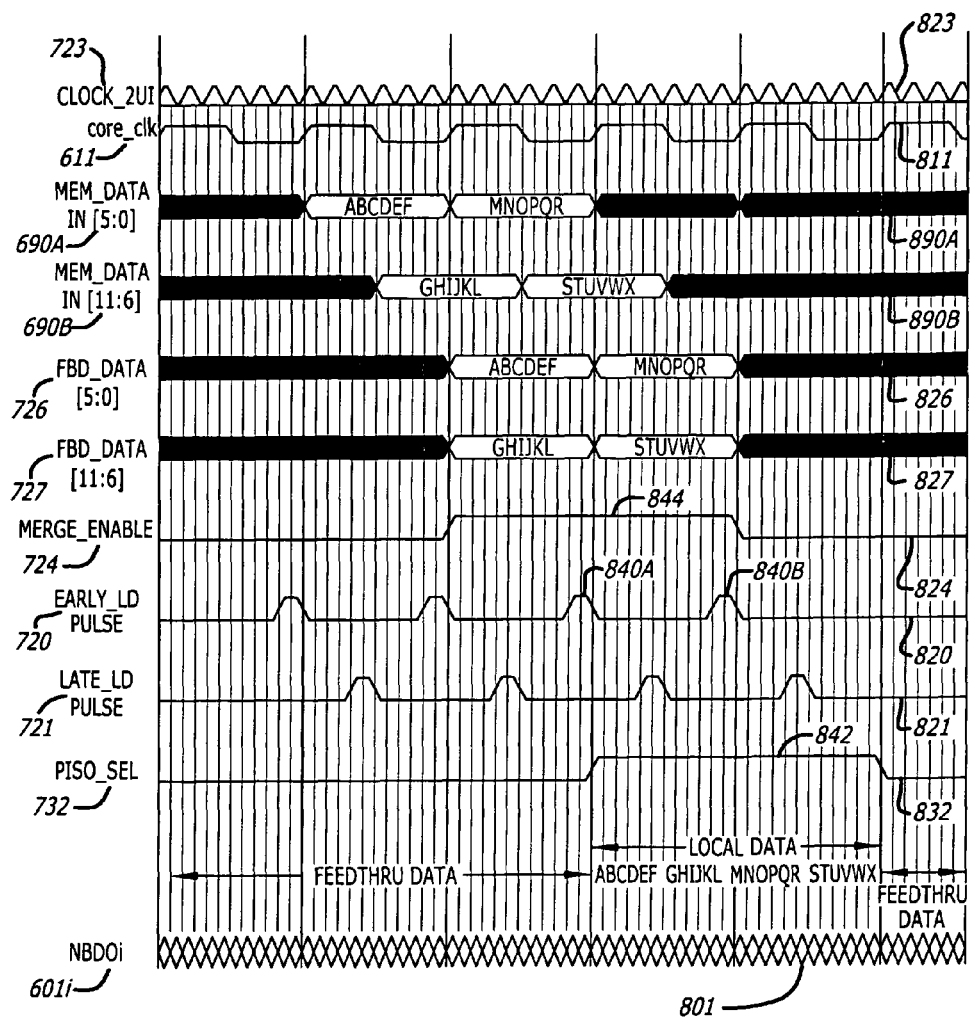
FIG. 8 illustrates a timing diagram of signals for a data merge logic slice functioning in a twelve bit mode.

Referring now to FIG. 8, a timing diagram of waveforms depicting the data merge logic slice 700*i* functioning in a twelve-bit mode is illustrated. That is, the 6 bit mode control signal 722 is a logical low in the timing diagram of FIG. 8.

In FIG. 8, Clock_2UI signal 723 is illustrated by the waveform 823. The core clock signal 611 is illustrated by the waveform 811. The lower six bits of data (MEM_DATA IN [5:0]) 690A on the parallel data bus 690 is illustrated by the waveform 890A. The upper six bits of data (MEM_DATA IN [11:6]) 690B on the parallel data bus 690 is illustrated by the waveform diagram 890B. The lower six bits of data (FBD_DATA [5:0]) 726 on the parallel data bus 660*i* is illustrated by the waveform diagram 826. The upper six bits of data (FBD_DATA [11:6]) 727 on the parallel data bus 660*i* is illustrated by the waveform diagram 827. The merge enable control signal 724 is illustrated by the waveform diagram 824. The early load pulse control signal 720 is illustrated by the waveform 820. The late load pulse control signal 721 is illustrated by the waveform 821. The local data select control signal (PISO_SEL) 732 is illustrated by the waveform 832. The single bit serial output data stream NBDOi 601*i* is illustrated by the waveform 801.

Without any local data to merge into the northbound serial data stream, the buffer 450 passes the received bits on the northbound data input 602 ("Feedthru Data" 725) to the transmitter 752*i* in the high speed clock domain, bypassing the core logic of the buffer 450. The local data select control signal (PISO_SEL) 732 is low when the Feedthru Data 725 is multiplexed into the transmitter 752*i* as is illustrated by the waveform 832.

As discussed previously, the "Early_Ld_Pulse" 720 is set up to be coincident with the beginning of a frame (as seen on the link) and the late_ld_pulse 721 is set up to be at half frame boundary during the initial training of a lane of the serial data link. A frame of data is a logical unit of data over the link when in a full frame operational mode and is made up of twelve bits of data in one embodiment of the invention.

In full frame operational mode, twelve bits of a frame are loaded into the PISO shift register using the "Early_Ld_Pulse" signal 720. The "late_ld_pulse" signal 721 is not used to load bits into the PISO shift registers. Both the upper and lower PISO shift registers 708A-708B are used in this mode. The six bit_mode control signal 722, being low in the twelve bit mode, causes the Data_Sel" signal 729 to be low in twelve bit mode by clearing the output of the D flip flop 706A. With the "Data_Sel" signal 729 being low in the twelve bit mode, the six lower data bits (FBD_DATA[5:0] 726 of bus 660*i* are coupled into the lower PISO Shift register 708B through the multiplexer 703.

The periodic generation of the Early_Ld_Pulse 720 also enables sampling of the "Merge_enable" signal 724 by the D flip flop 706B. The periodic generation of the Early_Ld_Pulse 720, being active high, selectively controls the multiplexer 702C to select the merge_enable signal 724 as its output data that is coupled into the data input D of the D flip-flop 706B.

As discussed previously, the merge enable signal 724 is generated at an appropriate time to insert local data from a given memory module into a lane of northbound serial data, replacing an idle frame or packet of data in the serial data stream. Waveform 824 illustrates an active high pulse 844 being generated when local data is made available on the upper bits (FBD_DATA [11:6]) 727 and lower bits (FBD_DATA [5:0]) 726 of the data bus 660i.

When the active high pulse 844 is generated in the waveform 824 of the merge enable signal 724, the pulses 840A-840B in the early_ld_pulse signal 720 allow the active high pulse 844 of the merge enable signal 724 to be sampled by the D flip-flop 706B using the clock__2UI signal 723. This causes an active high pulse 842 to be generated in the waveform 832 of the local data select signal (PISO_SEL) 732. The active high pulse 842 of the local data select signal (PISO_SEL) 732 causes the multiplexer 704 to switch from providing the two-bit "Feedthru Data" 725 at its output to provide the two-bit serialized local data 735 at its output instead. The switch from feed-through data 725 to local data 735 occurs at the frame boundary when the active high pulse 842 is first generated. This is because the falling edge of the "Early_Ld_Pulse" 720 that allows the PISO shift registers 708A-708B to start shifting is coincident with the frame starting point.

When merging data with the "Early_Ld_Pulse" 720 and the multiplexer output 731 both low, the PISO shift registers 708A-708B serially shift out the twelve bits of local data two bits at a time on the serial output 735 using the "Clock__2ui" clock signal 723. The transmitter 725i further serializes the two bits into a single bit serial data stream on the NBDOi output 601i as illustrated by the local data indicated above the waveform 801.

Figure 9:
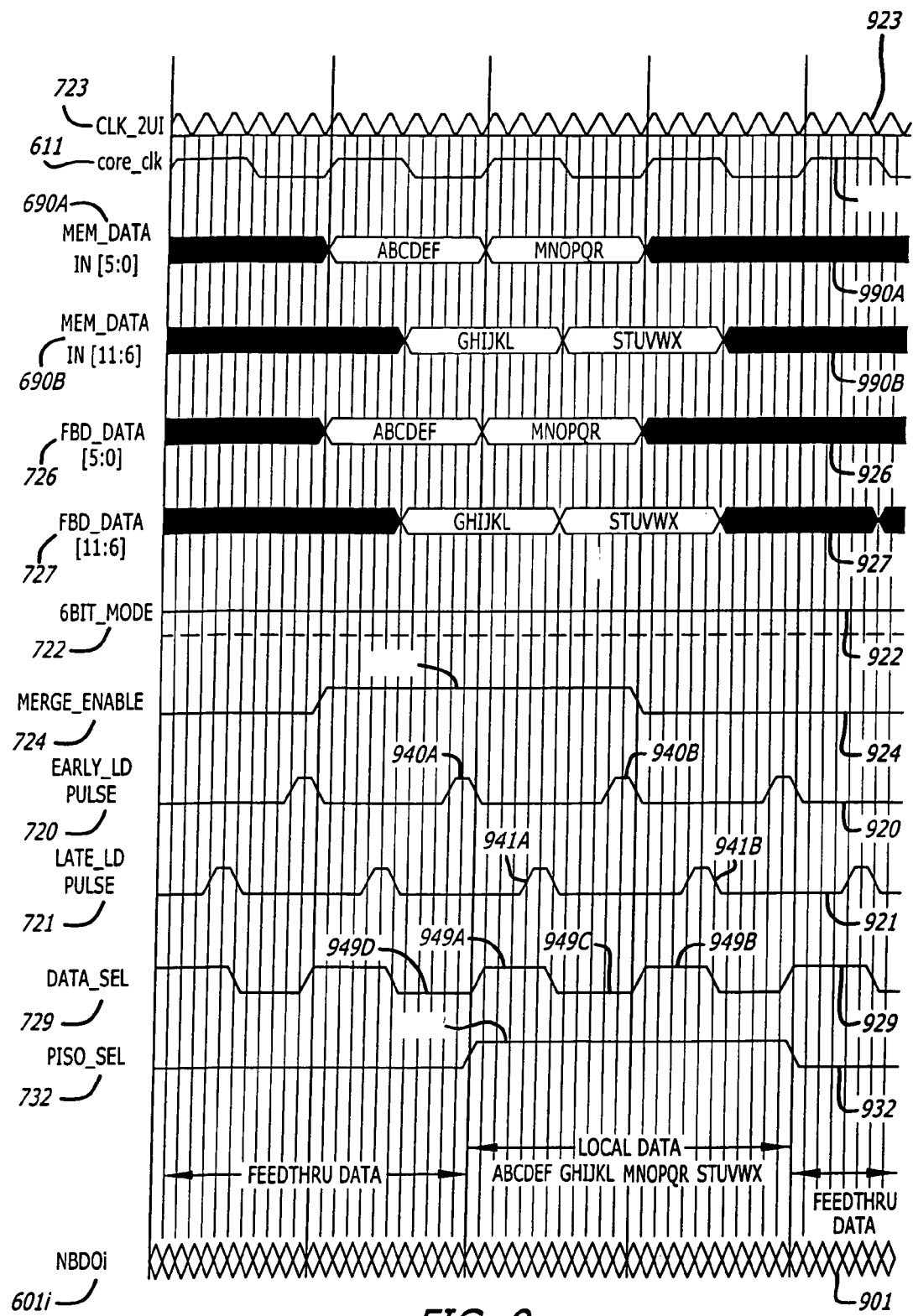
FIG. 9 illustrates a timing diagram of signals for a data merge logic slice functioning in a six-bit mode.

Referring now to FIG. 9, a timing diagram of waveforms depicting the data merge logic slice 700i functioning in a six-bit mode is illustrated. That is, the six-bit mode control signal (6BIT_MODE) 722 is a logical high as illustrated by the waveform 922 in the timing diagram of FIG. 9.

In FIG. 9, the Clock__2UI signal 723 is illustrated by the waveform 923. The core clock signal (core_clk) 611 is illustrated by the waveform 901. The lower six parallel data bits (MEM_DATA IN [5:0]) 690A on the memory data bus 690 are illustrated by the waveform 990A. The upper six parallel data bits (MEM_DATA IN [11:6]) 690B of the memory data bus 690 are illustrated by the waveform 990B. The lower six bits of data (FBD_DATA [5:0]) 726 on the parallel data bus 660i are illustrated by the waveform diagram 926. The upper six bits of data (FBD_DATA [11:6]) 727 on the parallel data bus 660i, are illustrated by the waveform diagram 927. The merge enable control signal 724 is illustrated by the waveform diagram 924 that occurs earlier than that of the waveform 824 in FIG. 8. The early load pulse control signal (EARLY_LD_PULSE) 720 is illustrated by the waveform 920. The late load pulse control signal (LATE_LD_PULSE) 721 is illustrated by the waveform 921. The data bus select control signal (DATA_SEL) 729 is illustrated by the waveform 929. The local data select control signal (PISO_SEL) 732 is illustrated by the waveform 932. The single bit serial output data stream NBDOi 601i is illustrated by the waveform 901.

In the six-bit mode, the lower PISO shift register 708B is used to convert parallel bits of data into serial data by shifting bits out. The data bus select signal (DATA_SEL) 729 toggles whether the least significant six bits of the frame, FBD_Data [5:0] 726, or the most significant six bits of the frame, FBD-_Data[1:6] 727, are loaded into the lower PISO shift register 708B through the selected output of the bus multiplexer 703.

Both of the "Early_Ld_Pulse" 720 and the "Late_Ld_Pulse" 721 can cause the lower PISO shift register 708B to either load data or shift data out because the output of the OR gate 710 is coupled into the load/shift-bar input of the lower PISO shift register 708B through the multiplexer 702A when the 6BIT_MODE signal 722 is active high.

When the "Early_Ld_Pulse" 720 and the "Late_Ld_Pulse" 721 are low, bits are shifted out from the lower PISO shift register 708B. Also during the parallel load of bits into the lower PISO shift register 708B when the load/shift-bar control input is high, bits previously loaded continue to be shifted out. When the load/shift-bar control input returns to low after a parallel load of data bits, the newly loaded bits are then shifted out by the lower PISO shift register 708B. In this manner, all six bits of data may be shifted out while a new set of parallel bits is being loaded.

The least significant six bits of the frame, FBD_Data[5:0] 726, are loaded into the lower PISO shift register 708B by the pulses 940A and 940B in waveform 920 of the "Early_Ld_Pulse" 720 when the data bus select signal (DATA_SEL) 729 is low, such as at low points 949C,949D for example. The most significant six bits of the frame, FBD_Data[11:6] 727, are loaded into the lower PISO shift register 708B by the pulses 941A and 941B in waveform 921 of the "Late_Ld_Pulse" 721 when the data bus select signal (DATA_SEL) 729 is high, during pulses 949A,949B for example.

In the six-bit mode, the switching between serialized "Feedthru_Data" 725 and the serialized local data 735 is similar to the twelve bit mode of operation described previously and is not repeated here for reasons of brevity.

When merging data, the PISO shift register 708B alternates between serially shifting out six most significant bits or six least significant bits of local data two bits at a time onto the serial output 735 using the Clock__2UI clock signal 723. The transmitter 725i further serializes the two bits into a single bit serial data stream on the NBDOi output 601i as illustrated by the local data indicated above the waveform 901.

While in a six-bit mode a full frame of data is still being transmitted, embodiments of the invention further reduce the latency of local data being merged into the serial data stream. In comparing FIGS. 8 and 9 together, the merging of local data occurs one frame time earlier in FIG. 9.

Embodiments of the invention enable merging of feed-through data and local data together into the serial data link on-the-fly without having to decode incoming packets of the serial input data stream to determine the location of an idle packet. Previously, the incoming serial data stream was received, depacketized/decoded, and reassembled into frames by the core logic before being re-transmitted. Embodiments of the invention avoid the depacketizing/decoding of the incoming serial data stream and its reassembly into frames of data and then encoding/packetizing for retransmission. The embodiments of the invention enable re-transmission of the incoming serial data stream and the merging of local data into the serial data stream without involving the core logic of a buffer integrated circuit. In a multi memory module system, the serial communication channels may continue to function even though a memory integrated circuit in one of the daisy chained memory modules is non-functional.

Embodiments of the invention are designed to provide for low latency memory access operations. This can allow a larger memory with more memory modules to be provided in each bank without memory access latency degrading the system performance as the number of memory modules increase in a channel.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, one embodiment of the invention has been described to provide a serial data link for a fully buffered dual inline memory module. However, embodiments of the invention may be implemented in other types of memory modules and systems. As another example, data was serialized two bits at a time on two bit buses around the PISO shift registers 708A-708B within the merge logic to provide relaxed data timing in one embodiment of the invention. However, embodiments of the invention may use a single bit output PISO with different clock timing and serialize the local data into a single bit serial data stream with the feed through data and multiplexers 704,705 being provided to support a single bit serial data stream.

What is claimed is:

1. An integrated circuit comprising:
a serial input/output interface with one or more lanes, each of the one or more lanes including a first parallel-in-serial-output (PISO) shift register having a parallel input coupled to a local data bus, a clock input coupled to a first clock signal, a load/shift-bar input coupled to a load signal, the first PISO shift register to serialize parallel data on the local data bus into serialized local data on a first serial output;
a first multiplexer having a first data input coupled to the first serial output, a second data input to receive feed-through data, a select input coupled to a local data select signal, the first multiplexer to merge the serialized local data and the feed-through data into a serial data stream on a multiplexed output responsive to the local data select signal; and
a transmitter having an input coupled to the multiplexed output to receive the serial data stream, the transmitter to drive the serial data stream onto a serial data link, wherein each of the one or more lanes further includes a bus multiplexer coupled between the local data bus and the first PISO shift register, the bus multiplexer having a first data input, coupled to the one half of the bits of the local data bus, a second data input coupled to the another half of the bits of the local data bus, a multiplexed output coupled to the parallel input of the first PISO shift register, and a select input coupled to a data bus select signal, the bus multiplexer to couple the one half of the bits of the local data bus or the another half of the bits of the local data bus into the parallel input of the first PISO shift register in response to the data bus select signal,
wherein each of the one or more lanes further includes control logic coupled to the first multiplexer and the first PISO shift register, the control logic to receive the first clock signal, a mode select signal, and a merge enable signal, the control logic to generate the local data select signal to merge the serialized local data and the feed-through data into the serial data stream in response to the merge enable signal and the first clock signal, the control logic to further generate the data bus select signal in response to the mode select signal, wherein the load signal is an early load pulse signal that is coupled into the load/shift-bar input of a second PISO shift register having a serial output coupled to a serial input of the first PISO shift register.

2. The integrated circuit of claim 1, wherein:
the feed-through data is two bits wide;
the parallel input of the first PISO shift register is at least six bits wide and the serial output of the first PISO shift register is two bits wide;
the first multiplexer is a two bit bus multiplexer and the serial data stream at the multiplexed output is two bits wide; and
the transmitter receives the two bit serial data stream and serializes it onto the serial data link as a single bit serial data stream.

3. The integrated circuit of claim 1, wherein the control logic has merge control logic that includes:
a second multiplexer having a first data input coupled to the merge enable signal and a select input coupled to the load signal; and
a D-type flip-flop coupled to the second multiplexer, the D-type flip-flop having a data input coupled to an output of the second multiplexer, and a clock input coupled to the first clock-signal, and a data output coupled to the select input of the first multiplexer and a second data input of the second multiplexer, the D-type flip-flop to register the merge enable signal in response to the load signal and the first clock signal to generate the local data select signal on the data output; and
wherein the second multiplexer is to recirculate the local data select signal into the data, input of the D-type flip-flop in response to an inverse of the load signal.

4. The integrated circuit of claim 3, wherein:
the control logic comprises merge control logic that includes:
a second multiplexer having a first data input coupled to the merge enable signal and a select input coupled to the early load pulse signal;
a first D-type flip-flop coupled to the second multiplexer, the first D-type flip-flop having a data input coupled to an output of the second multiplexer, and a clock input coupled to the first clock signal, and a data output coupled to the select input of the first multiplexer and a second data input of the second multiplexer, the first D-type flip-flop to register the merge enable signal in response to the early load pulse signal and the first clock signal to generate the local data select signal on the data output; and
wherein the second multiplexer to recirculate the local data select signal into the data input of the first D-type flip-flop in response to the early load pulse signal being a logical low and to couple the merge enable signal into the first D-type flip-flop in response to the early load pulse signal being a logical high;
the control logic further has mode control logic that includes:
a third multiplexer having a first data input coupled to the early load pulse signal;
a second D-type flip-flop coupled to the third multiplexer, the second D-type flip-flop having a data input coupled to an output of the third multiplexer, a clock input coupled to the first clock signal, a clear input coupled to an inverted bus mode signal, and a data output coupled to the select input of the bus multiplexer and a second data input of the third multiplexer, the second D-type flip-flop to generate the data bus select signal on the data output in response to the inverted bus mode signal, the early load pulse signal, and the first clock signal;
an OR gate having a first input coupled to the early load pulse signal and a second input coupled to a late load pulse signal, the OR gate to logically OR the early load pulse signal and the late load pulse signal;

an AND gate having a first input coupled to an output of the OR gate, a second input coupled to a bus mode signal, an output coupled to a select input of the third multiplexer;

an inverter having an input coupled to the bus mode signal and an output coupled to the clear input of the second D-type flip-flop, the inverter to generate the inverted bus mode signal in response to the bus mode signal;

a fourth multiplexer having a first data input coupled to the early load pulse signal, a second data input coupled to the output of the OR gate, a control input coupled to the bus mode signal, and a multiplexed output coupled to the load/shift-bar bar input of the first PISO shift register, wherein the third multiplexer to recirculate the data bus select signal into the data input of the second D-type flip-flop in response to the inverted bus mode signal; and wherein the fourth multiplexer to couple the early load pulse signal or both the early load pulse signal and the late load pulse signal into the load/shift-bar bar input of the first PISO shift register.

5. The integrated circuit of claim 4, wherein:
the integrated circuit is a buffer integrated circuit;
the local data bus is twelve bits wide; and
the bus multiplexer in each of the one or more lanes couples a lower six bits of the local bus into the first PISO shift register and an upper six bits of the local bus into the first PISO shift register in response to the data bus select signal.

6. An integrated circuit comprising:
a serial input/output interface with one or more lanes, each of the one or more lanes including a first parallel-in-serial-output (PISO) shift register having a parallel input coupled to a local data bus, a clock input coupled to a first clock signal, a load/shift-bar input coupled to a load signal, the first PISO shift register to serialize parallel data on the local data bus into serialized local data on a first serial output;

a first multiplexer having a first data input coupled to the first serial output, a second data input to receive feed-through data, a select input coupled to a local data select signal, the first multiplexer to merge the serialized local data and the feed-through data into a serial data stream on a multiplexed output responsive to the local data select signal;

a transmitter having an input coupled to the multiplexed output to receive the serial data stream, the transmitter to drive the serial data stream onto a serial data link;

a second multiplexer having a first data input coupled to a merge enable signal and a select input coupled to the load signal; and a D-type flip-flop coupled to the second multiplexer, the D-type flip-flop having a data input coupled to an output of the second multiplexer, and a clock input coupled to the first clock signal, and a data output coupled to the select input of the first multiplexer and a second data input of the second multiplexer, the D-type flip-flop to register the merge enable signal in response to the load signal and the first clock signal to generate the local data select signal on the data output; and wherein the second multiplexer is to recirculate the local data select signal into the data input of the D-type flip-flop in response to an inverse of the load signal, wherein each of the one or more lanes further includes control logic coupled to the first multiplexer and the first PISO shift register, the control logic to receive the first clock signal, a mode select signal, and a merge enable signal, the control logic to generate the local data select signal to merge the serialized local data and the feed-through data into the serial data stream in response to the merge enable signal and the first clock signal, the control logic to further generate the data bus select signal in response to the mode select signal, wherein the load signal is an early load pulse signal that is coupled into the load/shift-bar input of a second PISO shift register having a serial output coupled to a serial input of the first PISO shift register.

7. The integrated circuit of claim 6, wherein:
the feed-through data is two bits wide;
the parallel input of the first PISO shift register is at least six bits wide and the serial output of the first PISO shift register is two bits wide;
the first multiplexer is a two bit bus multiplexer and the serial data stream at the multiplexed output is two bits wide; and
the transmitter receives the two bit serial data stream and serializes it onto the serial data link as a single bit serial data stream.

8. The integrated circuit of claim 6, wherein each of the one or more lanes further includes a bus multiplexer coupled between the local data bus and the first PISO shift register, the bus multiplexer having a first data input coupled to the one half of the bits of the local data bus, a second data input coupled to the another half of the bits of the local data bus, a multiplexed output coupled to the parallel input of the first PISO shift register, and a select input coupled to a data bus select signal, the bus multiplexer to couple the one half of the bits of the local data bus or the another half of the bits of the local data bus into the parallel input of the first PISO shift register in response to the data bus select signal.

9. The integrated circuit of claim 6, wherein:
the control logic comprises merge control logic that includes:
the second multiplexer having a first data input coupled to the merge enable signal and a select input coupled to the early load pulse signal;
the first D-type flip-flop coupled to the second multiplexer, the first D-type flip-flop having a data input coupled to an output of the second multiplexer, and a clock input coupled to the first clock signal, and a data output coupled to the select input of the first multiplexer and a second data input of the second multiplexer, the first D-type flip-flop to register the merge enable signal in response to the early load pulse signal and the first clock signal to generate the local data select signal on the data output,
wherein the second multiplexer to recirculate the local data select signal into the data input of the first D-type flip-flop in response to the early load pulse signal being a logical low and to couple the merge enable signal into the first D-type flip-flop in response to the early load pulse signal being a logical high;
the control logic further has mode control logic that includes:
a third multiplexer having a first data input coupled to the early load pulse signal;
a second D-type flip-flop coupled to the third multiplexer, the second D-type flip-flop having a data input coupled to an output of the third multiplexer, a clock input coupled to the first clock signal, a clear input coupled to an inverted bus mode signal, and a data output coupled to the select input of the bus multiplexer and a second data input of the third multiplexer, the second D-type flip-flop to generate the data bus select signal on the data output in response to the inverted bus mode signal, the early load pulse signal, and the first clock signal;

an OR gate having a first input coupled to the early load pulse signal and a second input coupled to a late load pulse signal, the OR gate to logically OR the early load pulse signal and the late load pulse signal;

an AND gate having a first input coupled to an output of the OR gate, a second input coupled to a bus mode signal, an output coupled to a select input of the third multiplexer;

an inverter having an input coupled to the bus mode signal and an output coupled to the clear input of the second D-type flip-flop, the inverter to generate the inverted bus mode signal in response to the bus mode signal;

a fourth multiplexer having a first data input coupled to the early load pulse signal, a second data input coupled to the output of the OR gate, a control input coupled to the bus mode signal, and a multiplexed output coupled to the load/shift-bar input of the first PISO shift register, wherein the third multiplexer to recirculate the data bus select signal into the data input of the second D-type flip-flop in response to the inverted bus mode signal; and wherein the fourth multiplexer to couple the early load pulse signal or both the early load pulse signal and the late load pulse signal into the load/shift-bar input of the first PISO shift register.

10. The integrated circuit of claim 9, wherein:

the integrated circuit is a buffer integrated circuit;

the local data bus is twelve bits wide; and the bus multiplexer in each of the one or more lanes couples a lower six bits of the local bus into the first PISO shift register and an upper six bits of the local bus into the first PISO shift register in response to the data bus select signal.

* * * * *